US012604589B2

(12) United States Patent
Kim et al.

(10) Patent No.: US 12,604,589 B2
(45) Date of Patent: Apr. 14, 2026

(54) DISPLAY DEVICE AND METHOD FOR MANUFACTURING THE SAME

(71) Applicant: Samsung Display Co., LTD., Yongin-si (KR)

(72) Inventors: Jin Wan Kim, Hwaseong-si (KR); Seung Geun Lee, Hwaseong-si (KR); Sang Jo Kim, Daejeon (KR); Hoo Keun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 587 days.

(21) Appl. No.: 18/045,814

(22) Filed: Oct. 11, 2022

(65) Prior Publication Data

US 2023/0111380 A1 Apr. 13, 2023

(30) Foreign Application Priority Data

Oct. 13, 2021 (KR) ........................ 10-2021-0135530

(51) Int. Cl.
H10H 29/10 (2025.01)
H10H 20/01 (2025.01)
(Continued)

(52) U.S. Cl.
CPC ...... H10H 29/10 (2025.01); H10H 20/01335 (2025.01); H10H 20/812 (2025.01);
(Continued)

(58) Field of Classification Search
CPC ............. H10H 29/10; H10H 20/01335; H10H 20/812; H10H 20/831; H10H 20/857;
(Continued)

(56) References Cited

U.S. PATENT DOCUMENTS 10,804,429 B2 10/2020 Wildeson et al.
11,081,622 B2 8/2021 Wildeson et al.
(Continued)

FOREIGN PATENT DOCUMENTS

EP 3671842 A1 * 6/2020 ............. H01L 21/77
JP 2008-263127 A 10/2008
(Continued)

OTHER PUBLICATIONS

Korean Office Action for KR Application No. 10-2021-0135530, dated Apr. 28, 2025, 8 pps.
(Continued)

*Primary Examiner* — Shahed Ahmed
(74) *Attorney, Agent, or Firm* — Womble Bond Dickinson (US) LLP

(57) ABSTRACT

A display device and a method for manufacturing the same are provided. The display device includes a substrate, pixel electrodes on the substrate, and light emitting elements on the pixel electrodes, each of the light emitting elements including a first stack configured to emit first light, a second stack below the first stack, and configured to emit second light, a third stack below the second stack, and configured to emit third light, and tunnel function layers respectively between the first stack and the second stack, and between the second stack and the third stack.

17 Claims, 32 Drawing Sheets

(51) Int. Cl.

| | | |
|---|---|---|
| *H10H 20/812* | (2025.01) | |
| *H10H 20/831* | (2025.01) | |
| *H10H 20/857* | (2025.01) | |

(52) U.S. Cl.
CPC ........ *H10H 20/831* (2025.01); *H10H 20/857* (2025.01); *H10H 20/032* (2025.01); *H10H 20/0364* (2025.01)

(58) Field of Classification Search
CPC ............. H10H 20/032; H10H 20/0364; H10H 20/811; H10H 29/14; H10H 20/01; H10H 20/81; H10H 20/813; H10H 20/83; H10H 20/00–882; H10H 29/00–142; H10H 29/30–962; H10K 59/123
See application file for complete search history.

(56) References Cited

U.S. PATENT DOCUMENTS

| | | | |
|---|---|---|---|
| 11,594,572 B2 | 2/2023 | Wildeson et al. | |
| 2013/0285076 A1 | 10/2013 | Liu et al. | |
| 2018/0323338 A1* | 11/2018 | Grundmann | .......... H10D 8/825 |
| 2019/0198561 A1* | 6/2019 | Wildeson | ............. H10H 29/142 |

| | | | |
|---|---|---|---|
| 2019/0198709 A1 | 6/2019 | Wildeson et al. | |
| 2020/0328327 A1 | 10/2020 | He et al. | |
| 2021/0098526 A1 | 4/2021 | Cho et al. | |

FOREIGN PATENT DOCUMENTS

| | | | | |
|---|---|---|---|---|
| JP | 2013239523 A | * | 11/2013 | |
| KR | 10-2018-0118488 A | | 10/2018 | |
| KR | 2018-0129648 A | | 12/2018 | |
| KR | 10-1968592 B1 | | 4/2019 | |
| KR | 20200116006 A | * | 12/2019 | |
| KR | 2020-0091408 A | | 7/2020 | |
| KR | 2020-0098669 A | | 8/2020 | |
| KR | 10-2022-0049065 A | | 4/2022 | |

OTHER PUBLICATIONS

Baek et al., "Monolithic Multi-Color Tunable Inorganic Light-Emitting Diodes; Advanced Electronic Materials," Adv. Electron. Mater. 2021, 202100598, pp. 1-9.

Li et al., "Demonstration of high efficiency cascaded blue and green micro-light-emitting diodes with independent junction control," Applied Physics Letters 118, 261104 (2021), 4 sheets.

\* cited by examiner

S100 step of stacking a plurality of semiconductor
material layers on second substrate

S200 forming a plurality of light emitting elements by
etching the plurality of semiconductor material layers

S300 forming connection electrodes on light emitting elements

S400 bonding second substrate onto semiconductor circuit board

FIG. 21

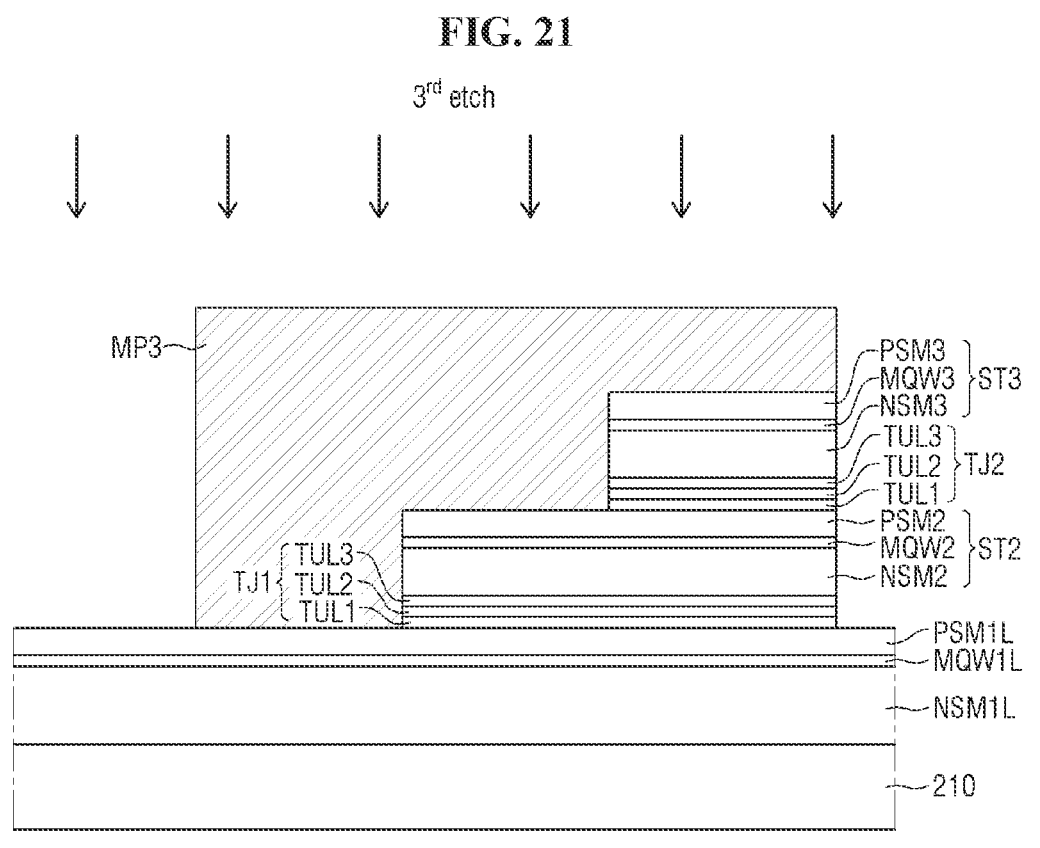

3$^{rd}$ etch

DISPLAY DEVICE AND METHOD FOR MANUFACTURING THE SAME

CROSS-REFERENCE TO RELATED APPLICATION

This application claims priority to, and the benefit of, Korean Patent Application No. 10-2021-0135530 filed on Oct. 13, 2021 in the Korean Intellectual Property Office the contents of which in its entirety are herein incorporated by reference.

BACKGROUND

Technical Field

The present disclosure relates to a display device and a method for manufacturing the same.

Description of the Related Art

With the advancement of the information age, the demand for a display device for displaying an image has increased with various forms. The display device may be a flat panel display device, such as a liquid crystal display device, a field emission display device, and a light emitting display. The light emitting display device may include an organic light emitting display device including an organic light emitting diode element as a light emitting element, and may include an inorganic light emitting display device including an inorganic semiconductor element as a light emitting element or a micro light emitting diode element as a light emitting element.

Recently, a head mounted display including a light emitting display device has been developed. The head mounted display (HMD) is a glasses type monitor device of a virtual reality (VR) or augmented reality (AR), which is worn by a user in the form of glasses or helmet and forms a focus at a distance close to eyes of the user.

A high-resolution micro light emitting diode display panel including a micro light emitting diode element is applied to a head mounted display. Because the micro light emitting diode element emits light of a single color, the micro light emitting diode display panel may include a wavelength conversion layer for converting a wavelength of light emitted from the micro light emitting diode element to display various colors.

SUMMARY

An aspect of the present disclosure provides a display device and a method for manufacturing the same, in which subpixels are omitted and one pixel is implemented by one light emitting element to obtain high resolution.

The aspects of the present disclosure are not limited to those mentioned above, and additional aspects of the present disclosure, which are not mentioned herein, will be clearly understood by those skilled in the art from the following description of the present disclosure.

According to one or more embodiments of the disclosure, a display device includes a substrate, pixel electrodes on the substrate, and light emitting elements on the pixel electrodes, each of the light emitting elements including a first stack configured to emit first light, a second stack below the first stack, and configured to emit second light, a third stack below the second stack, and configured to emit third light, and tunnel function layers respectively between the first stack and the second stack, and between the second stack and the third stack.

The first stack may include a first active layer for emitting the first light, wherein the second stack includes a second active layer for emitting the second light, and wherein the third stack includes a third active layer for emitting the third light.

The first light may be blue light, the second light may be green light, and the third light may be a red light.

The first stack may include a first n-type semiconductor layer and a first p-type semiconductor layer, which are spaced apart from each other with the first active layer interposed therebetween, wherein the second stack includes a second n-type semiconductor layer and a second p-type semiconductor layer, which are spaced apart from each other with the second active layer interposed therebetween, and wherein the third stack includes a third n-type semiconductor layer and a third p-type semiconductor layer, which are spaced apart from each other with the third active layer interposed therebetween.

The tunnel function layers may include a first tunnel function layer between the first stack and the second stack, and a second tunnel function layer between the second stack and the third stack, wherein each of the first tunnel function layer and the second tunnel function layer includes a first tunnel layer including an n-type semiconductor, a second tunnel layer including an n-type semiconductor, and a third tunnel layer including a p-type semiconductor.

The second tunnel layer may be between the first tunnel layer and the third tunnel layer, wherein a thickness of the second tunnel layer is less than a thickness of the first tunnel layer, and is less than a thickness of the third tunnel layer.

A concentration of a p-type dopant doped in the third tunnel layer may be lower than a concentration of an n-type dopant doped in the first tunnel layer, and may be less than a concentration of an n-type dopant doped in the second tunnel layer.

The first tunnel layer of the first tunnel function layer may be in contact with the first p-type semiconductor layer of the first stack, wherein the third tunnel layer of the first tunnel function layer is in contact with the second n-type semiconductor layer of the second stack, wherein the first tunnel layer of the second tunnel function layer is in contact with the second p-type semiconductor layer of the second stack, and wherein the third tunnel layer of the second tunnel function layer is in contact with the third n-type semiconductor layer of the third stack.

The first n-type semiconductor layer of the first stack may be a common layer located continuously in the light emitting elements.

The display device may further include connection electrodes for connecting the pixel electrodes with the light emitting elements, the connection electrodes including a first connection electrode connected to the first p-type semiconductor layer of the first stack, a second connection electrode connected to the second p-type semiconductor layer of the second stack, a third connection electrode connected to the third p-type semiconductor layer of the third stack, and a common connection electrode connected to the first n-type semiconductor layer of the first stack.

The first stack may be configured to be driven by driving signals applied to the first connection electrode and the common connection electrode, wherein the second stack is configured to be driven by driving signals applied to the first connection electrode and the second connection electrode, and wherein the third stack is configured to be driven by driving signals applied to the second connection electrode and the third connection electrode.

Each of the first active layer, the second active layer, and the third active layer may include indium, wherein an indium content of the third active layer is greater than that of the second active layer, and wherein an indium content of the second active layer is greater than that of the first active layer.

According to one or more embodiments of the disclosure, a display device includes a substrate, pixel electrodes on the substrate, and light emitting elements on the pixel electrodes, each of the light emitting elements including a first stack for emitting first light in accordance with a first driving current, a second stack for emitting second light in accordance with a second driving current, a third stack for emitting third light in accordance with a third driving current, and tunnel function layers respectively between the first stack and the second stack, and between the second stack and the third stack.

A current density of the first driving current may be maintained uniformly regardless of a gray scale of the first stack, wherein a current density of the second driving current is maintained uniformly regardless of a gray scale of the second stack, and wherein a current density of the third driving current is maintained uniformly regardless of a gray scale of the third stack.

An application period of the first driving current may be configured to be adjusted in accordance with the gray scale of the first stack, wherein an application period of the second driving current is configured to be adjusted in accordance with the gray scale of the second stack, and wherein an application period of the third driving current is configured to be adjusted in accordance with the gray scale of the third stack.

A first light emission area for emitting the first light may be partitioned by a planar size of the first stack, wherein a second light emission area for emitting the second light is partitioned by a planar size of the second stack, and wherein a third light emission area for emitting the third light is partitioned by a planar size of the third stack.

A size of the first light emission area may be larger than that of the second light emission area, wherein a size of the second light emission area is larger than that of the third light emission area.

According to one or more embodiments of the disclosure, a method for manufacturing a display device includes stacking semiconductor material layers on a substrate, etching the semiconductor material layers to form light emitting elements, in which a first stack, a first tunnel function layer, a second stack, a second tunnel function layer, and a third stack are sequentially stacked, forming connection electrodes respectively on the light emitting elements, forming a semiconductor circuit board including pixel electrodes, and bonding the substrate onto the semiconductor circuit board.

The connection electrodes may be electrically connected to the pixel electrodes.

The first tunnel function layer and the second stack may be etched in a same process, wherein the second tunnel function layer and the third stack are etched in a same process.

In the display device and the method for manufacturing the same according to embodiments of the present disclosure, tunnel function layers are located between a plurality of stacks of a light emitting element to enable movement of electrons and holes between the stacks, whereby each stack of the light emitting element may emit light. Therefore, as one light emitting element emits blue light, green light, and red light, a plurality of subpixels may be omitted, and one pixel may be configured by one light emitting element. As a result, a structure and a manufacturing process of the display device may be simplified, and the display device of high resolution may be implemented.

In addition, as electrodes are respectively located in the plurality of stacks of the light emitting element, the plurality of stacks may individually, concurrently, or substantially simultaneously, emit light. Also, a period for applying a current in each stack may be adjusted to represent a gray scale, whereby a full color may be implemented.

The aspects according to the embodiments of the present disclosure are not limited to those mentioned above, and more various aspects are included in the following description of the present disclosure.

BRIEF DESCRIPTION OF THE DRAWINGS

The above and other aspects of the present disclosure will become more apparent by describing in detail embodiments thereof with reference to the attached drawings, in which:

FIG. 3 is a detailed layout view illustrating an area B of FIG. 2;

FIG. 5 is a cross-sectional view illustrating an example of a display panel taken along the line Q1-Q1' of FIG. 2;

FIGS. 16 to 28 are cross-sectional and perspective views illustrating a method for manufacturing a display device according to one or more embodiments of the present disclosure;

DETAILED DESCRIPTION

Figure 1:
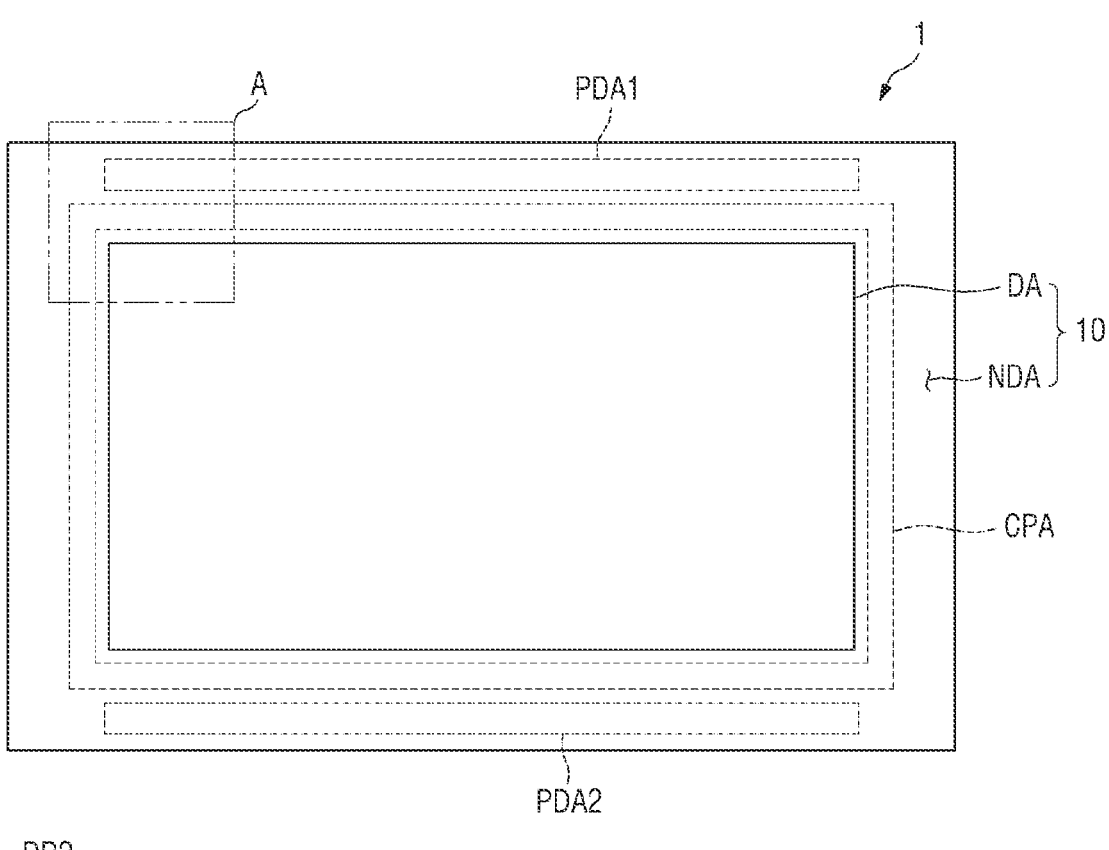
FIG. 1 is a layout view illustrating a display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section.

Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
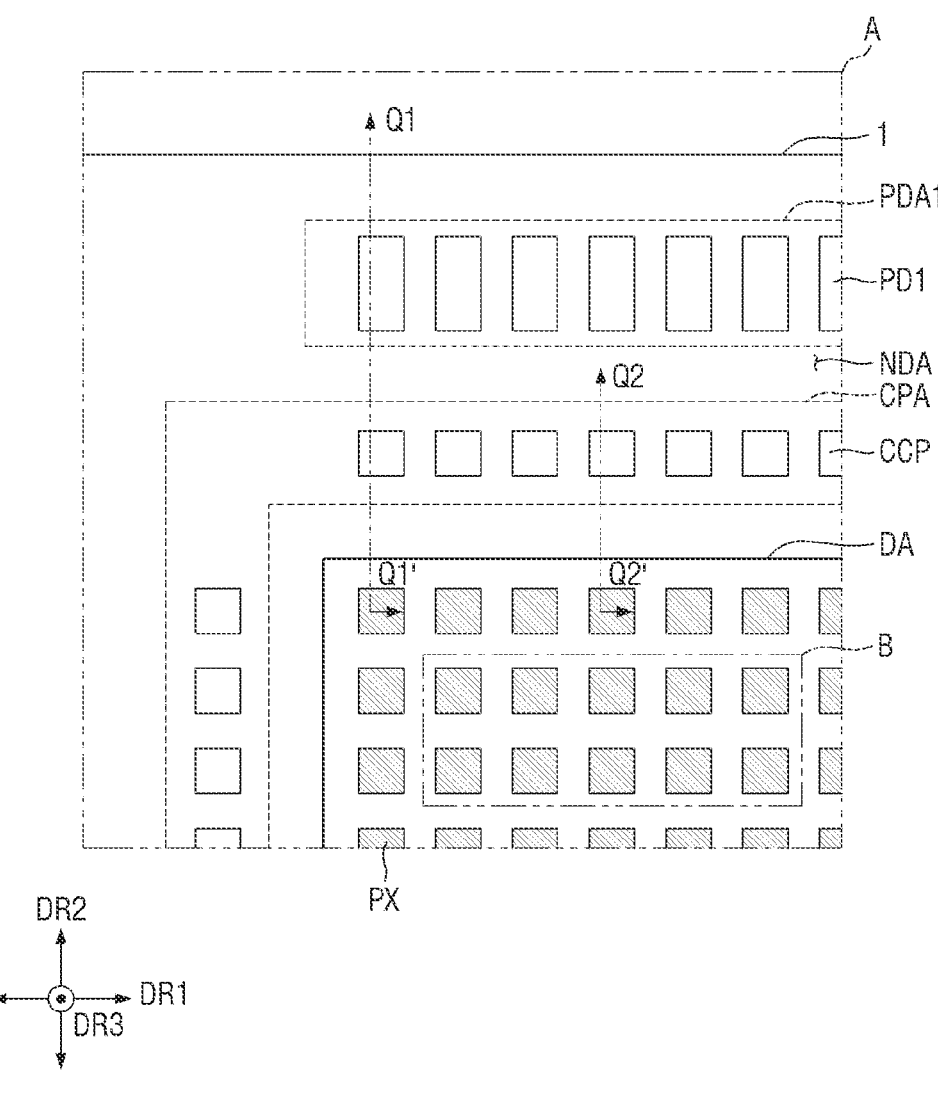
FIG. 2 is a detailed layout view illustrating an area A of FIG. 1.
Figure 3:
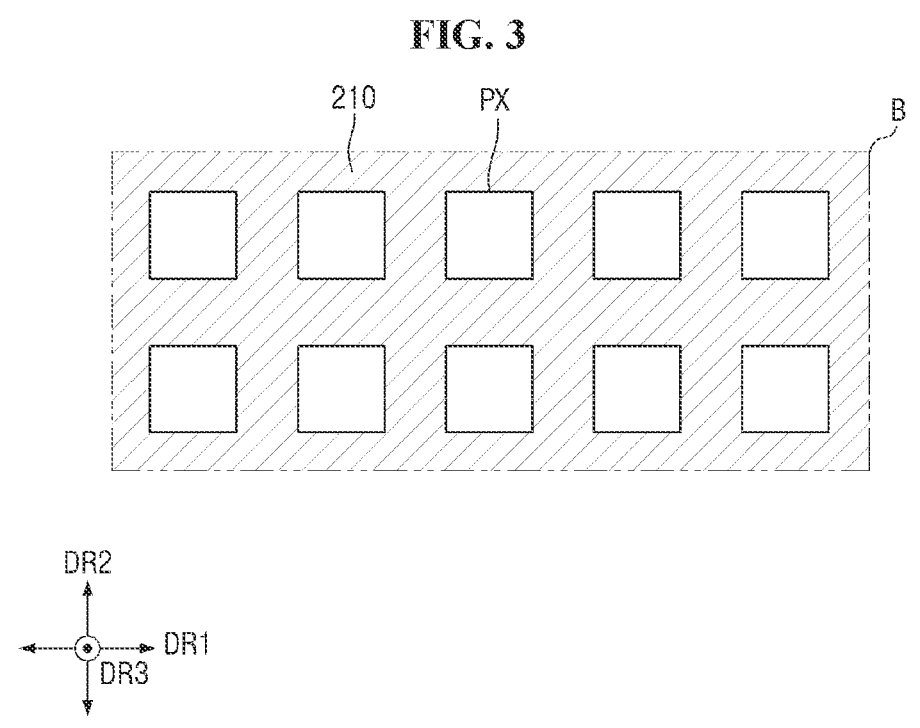
Figure 4:
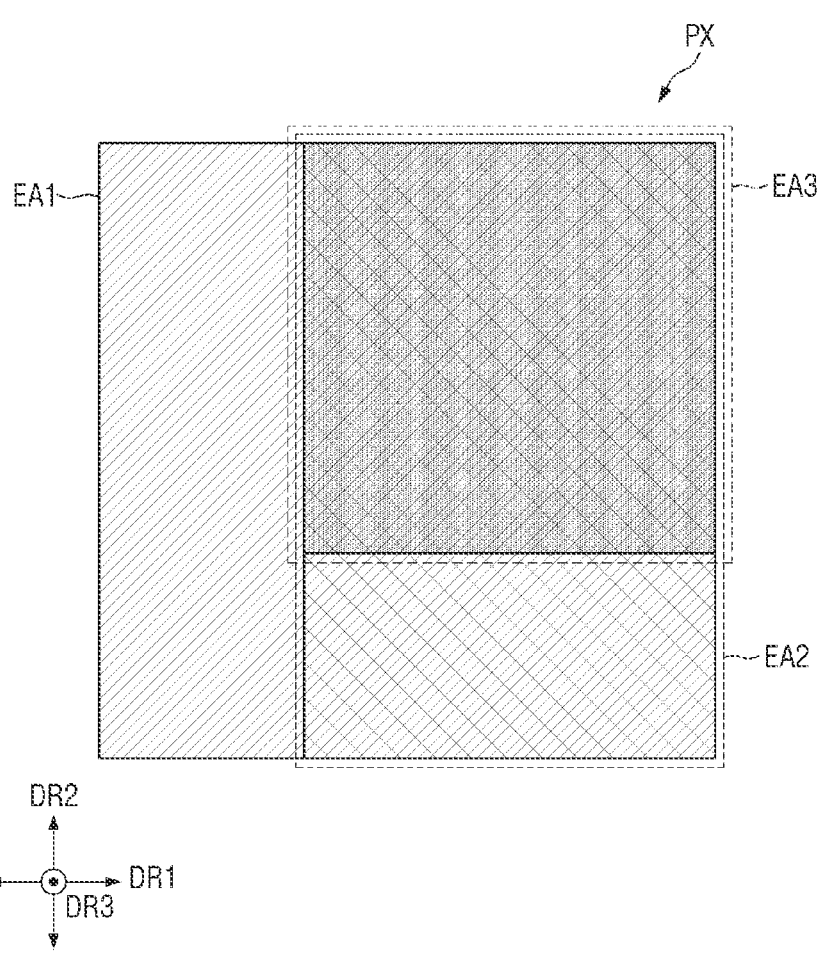
FIG. 4 is a plan view illustrating one pixel according to one or more embodiments of the present disclosure.

FIG. 1 is a layout view illustrating a display device according to one or more embodiments of the present disclosure. FIG. 2 is a detailed layout view illustrating an area A of FIG. 1. FIG. 3 is a detailed layout view illustrating an area B of FIG. 2. FIG. 4 is a plan view illustrating one pixel according to one or more embodiments of the present disclosure.

Although the display device according to one or more embodiments of the present disclosure is a subminiature light emitting diode display device (or micro light emitting diode display device) including a subminiature light emitting diode (or micro light emitting diode) as a light emitting element in FIGS. 1 to 4, the present disclosure is not limited thereto.

Also, although the display device according to one or more embodiments of the present disclosure is described as a light emitting diode on silicon (LEDoS) having light emitting diodes located on a semiconductor circuit board formed by a semiconductor process in FIGS. 1 to 4, it should be noted that the present disclosure is not limited thereto.

In addition, in FIGS. 1 to 4, a first direction DR1 indicates a horizontal direction of a display panel 10, a second direction DR2 indicates a vertical direction of the display panel 10, and a third direction DR3 indicates a thickness direction of the display panel 10. In this case, "left," "right," "up," and "down" indicate directions when the display panel 10 is viewed from the plane. For example, "right" indicates one side of the first direction DR1, "left" indicates the other side of the first direction DR1, "upper" may indicate one side of the second direction DR2, and "lower" may indicate the other side of the second direction DR2. In addition, "upper" may indicate one side of the third direction DR3, and "lower" may indicate the other side of the third direction DR3.

Referring to FIGS. 1 to 4, the display device 1 according to one or more embodiments comprises a display panel 10 that includes a display area DA and a non-display area NDA.

The display panel 10 may have a rectangular plane shape having a long side in the first direction DR1, and a short side in the second direction DR2, but the plane shape of the display panel 10 is not limited thereto. The display panel 10 may have another polygonal shape in addition to the rectangular plane shape, a circular shape, an oval shape, or an irregular plane shape.

The display area DA may be an area where an image is displayed, and the non-display area NDA may be an area where an image is not displayed. The plane shape of the display area DA may follow the plane shape of the display panel 10. In the example of FIG. 1, the plane shape of the display area DA is a rectangular shape. The display area DA may be located in a central area of the display panel 10. The non-display area NDA may be located in the vicinity of the display area DA. The non-display area NDA may be located to surround the display area DA.

The display area DA of the display panel 10 may include a plurality of pixels PX. The pixels PX may be defined as a minimum light emission unit capable of displaying white light, in some embodiments.

Each of the plurality of pixels PX may include light emission areas EA1, EA2, and EA3, each of which emits light. Each of the plurality of pixels PX may include three light emission areas EA1, EA2, and EA3, but the present disclosure is not limited thereto.

Each of the plurality of pixels PX may include light emitting elements LE for emitting first light, second light, and third light. The light emitting element LE may have rectangular plane shape, but the present disclosure is not limited thereto. For example, the light emitting element LE may have another polygonal shape in addition to the rectangular plane shape, a circular shape, an oval shape, or an irregular shape.

The first light emission area EA1 indicates an area that emits first light. Each of the first light emission areas EA1 may output the first light output from the light emitting element LE as it is. The first light may be the light of a blue wavelength band. The blue wavelength band may range from about 370 nm to about 460 nm, approximately, but the present disclosure is not limited thereto.

The second light emission area EA2 indicates an area for emitting second light. Each of the second light emission areas EA2 may output the second light emitted from the light emitting element LE as it is. The second light may be the light of a green wavelength band. The green wavelength band may range from about 480 nm to about 560 nm, approximately, but the present disclosure is not limited thereto.

The third light emission area EA3 indicates an area for emitting third light. Each of the third light emission areas EA3 may output the third light emitted from the light emitting element LE as it is. The third light may be the light of a red wavelength band. The red wavelength band may range from about 600 nm to about 750 nm, approximately, but the present disclosure is not limited thereto.

A first stack ST1 (see FIG. 6) corresponding to the first light emission areas EA1, a second stack ST2 (see FIG. 6) corresponding to the second light emission areas EA2, and a third stack ST3 (see FIG. 6) corresponding to the third light emission areas EA3 may be arranged to be sequentially be stacked in a direction opposite to the third direction DR3. For example, the first light emission areas EA1 may be located at the uppermost portion in the third direction DR3, the second stack ST2 corresponding to the second light emission areas EA2 may be located under the first stack ST1 on the first light emission area EA1 in the third direction DR3, and the third stack ST3 corresponding to the third light emission areas EA3 may be located under the second stack ST2 in the third direction DR3. Therefore, the second stack ST2 and the first stack ST1 may sequentially be located in the third direction DR3 from the third stack ST3.

The first light emission area EA1 may be the same as an entire size of the pixel PX. The second light emission area EA2 may be smaller than the size of the first light emission area EA1, and the third light emission area EA3 may be smaller than the size of the second light emission area EA2. However, the present disclosure is not limited to this example. For example, the third light emission area EA3 may be the largest area, the second light emission area EA2 may be smaller than the third light emission area EA3, and the first light emission area EA1 may be smaller than the second light emission area EA2. In one or more other embodiments, the second light emission area EA2 may be the largest area, the first light emission area EA1 may be smaller than the second light emission area EA2, and the third light emission area EA3 may be smaller than the first light emission area EA1.

Although FIGS. 2 to 4 illustrate that each of the plurality of light emission areas EA1, EA2, and EA3 has a rectangular plane shape, the present disclosure is not limited thereto. For example, each of the plurality of light emission areas EA1, EA2, and EA3 may have another polygonal shape in addition to the rectangular shape, a circular shape, an oval shape, or an irregular shape.

The non-display area NDA may include a first pad area PDA1 and a second pad area PDA2.

The first pad area PDA1 may be located in the non-display area NDA. The first pad area PDA1 may be located above the display area DA. The first pad area PDA1 may include first pads PD1 connected with an external circuit board (CB of FIG. 5).

The second pad area PDA2 may be located in the non-display area NDA. The second pad area PDA2 may be located below the display area DA. The second pad area PDA2 may include second pads for being connected with the external circuit board (CB of FIG. 5). The second pad area PDA2 may be omitted in other embodiments.

Also, the non-display area NDA may further include a common electrode connecting portion CPA surrounding the display area DA. The common electrode connecting portion CPA may be located in the non-display area NDA. The common electrode connecting portion CPA may be located between the first pad area PDA1 and the display area DA, and between the second pad area PDA2 and the display area DA. Also, the common electrode connecting portion CPA may be located on one side and the other side of the display area DA with respect to the first direction DR1, and may be located on one side and the other side of the display area DA with respect to the second direction DR2. The common electrode connecting portion CPA may include a plurality of connection electrodes CCP for being connected with the semiconductor circuit board.

Although FIG. 1 illustrates that the common electrode connecting portion CPA fully surrounds the display area DA, the present disclosure is not limited thereto. For example, the common electrode connecting portion CPA may be located on one side, both sides, or at least three sides of the display area DA.

Figure 5:
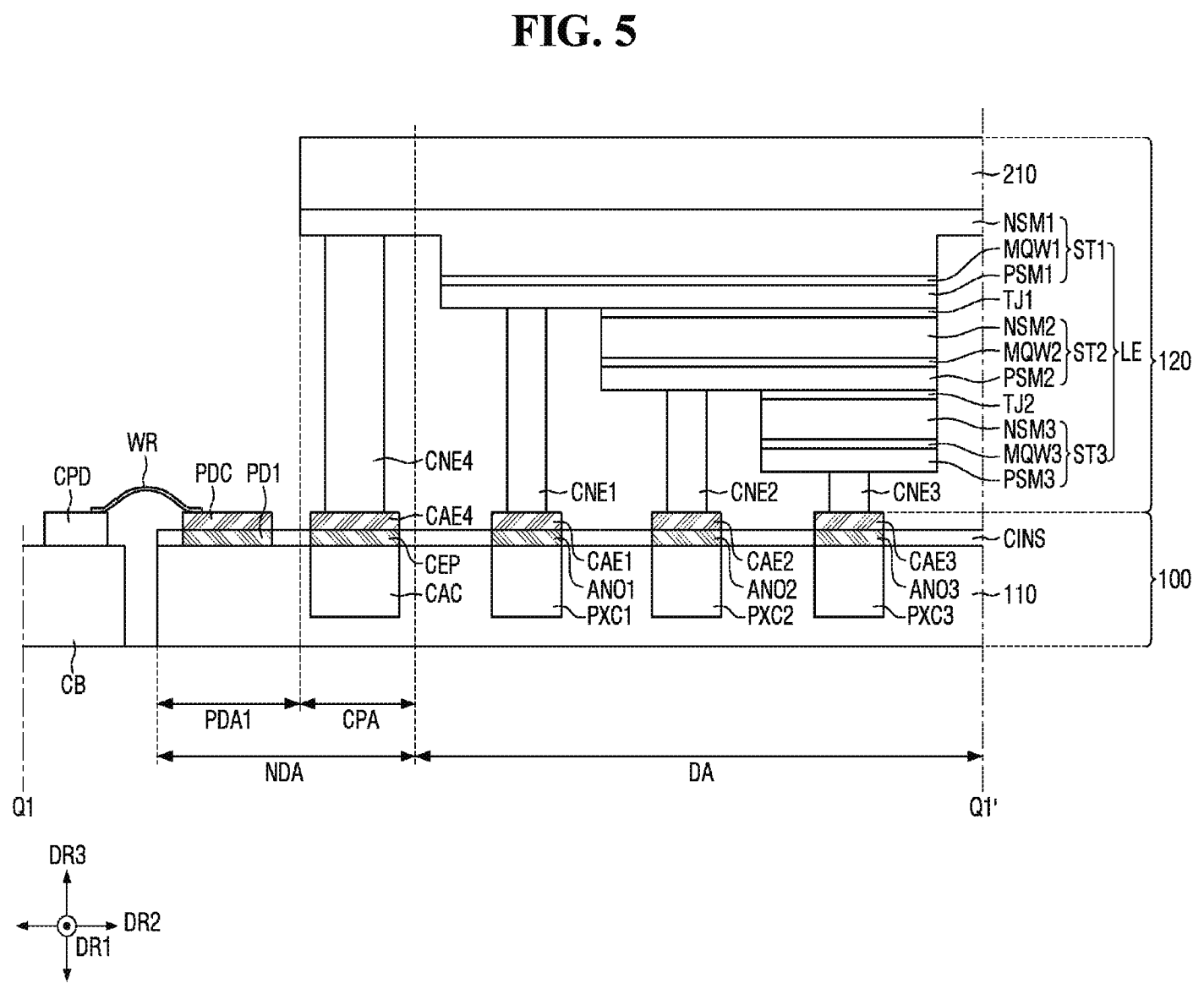
Figure 6:
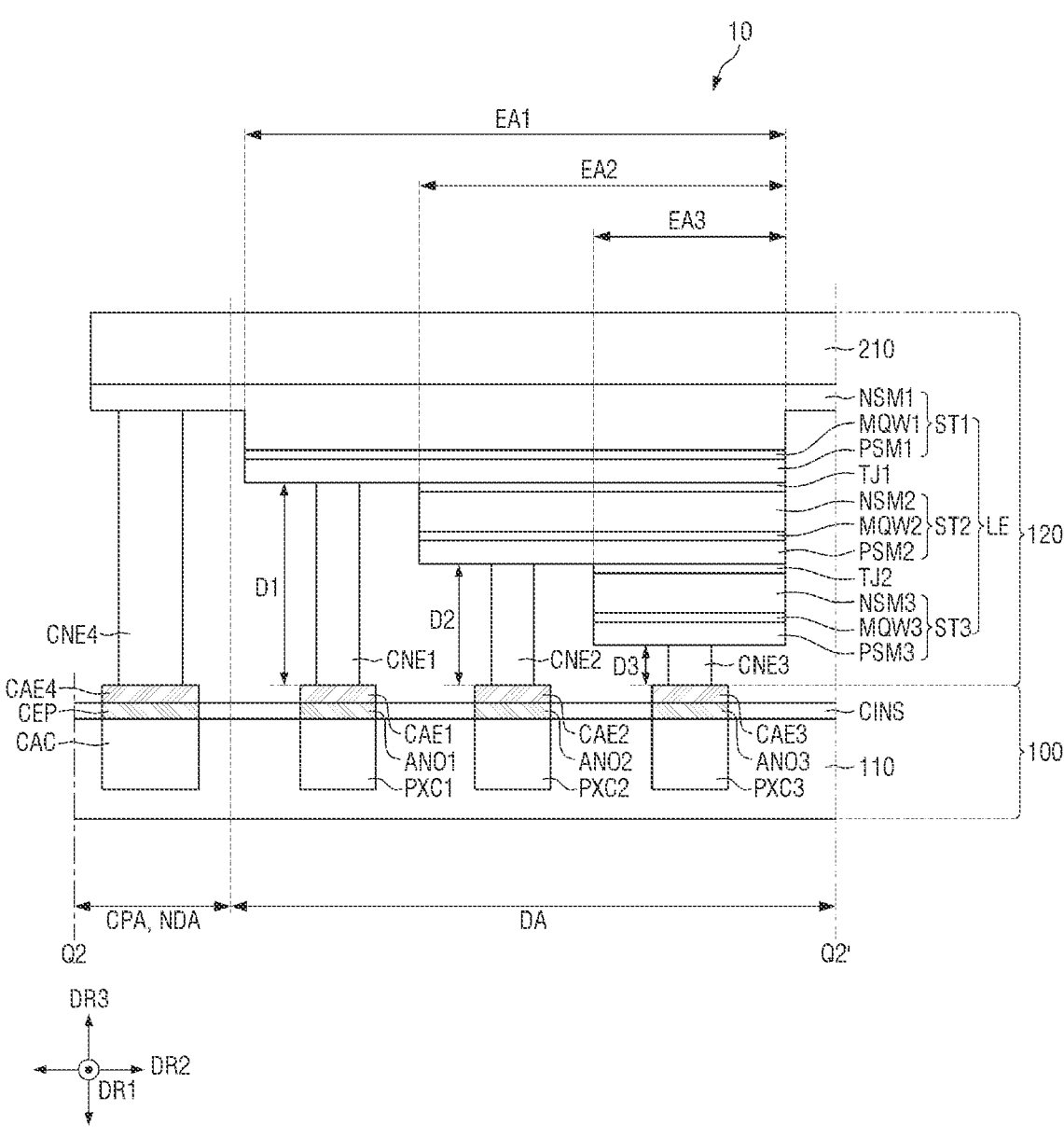
FIG. 6 is a cross-sectional view illustrating an example of a display panel taken along the line Q2-Q2' of FIG. 2.
Figure 7:
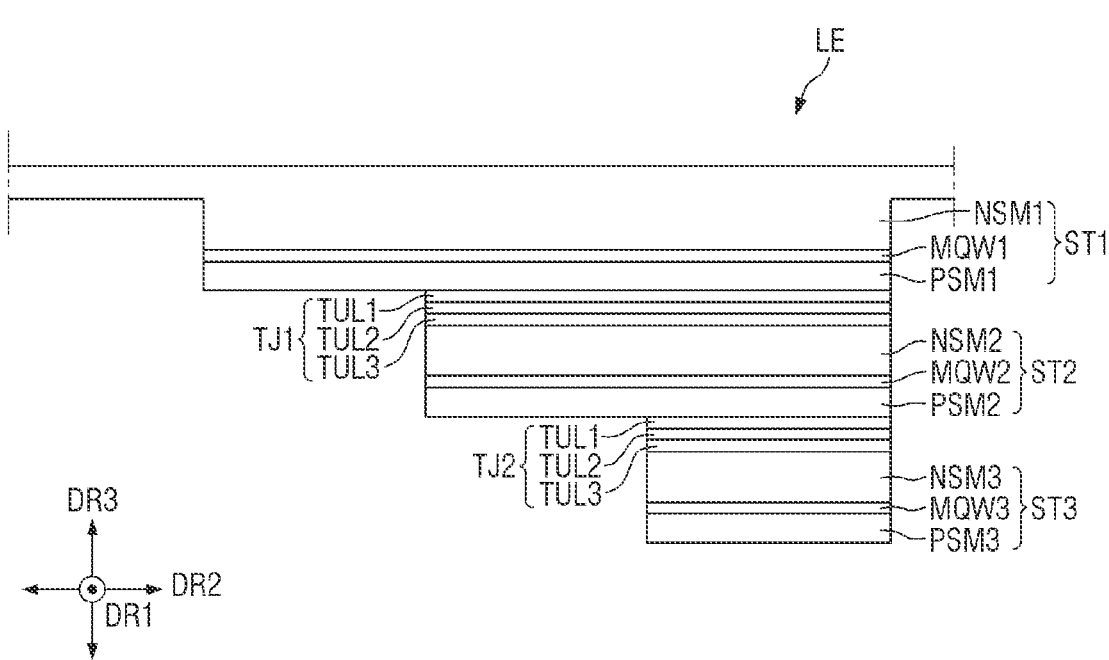
FIG. 7 is a cross-sectional view illustrating an example of a light emitting element of a display panel according to one or more embodiments of the present disclosure.
Figure 8:
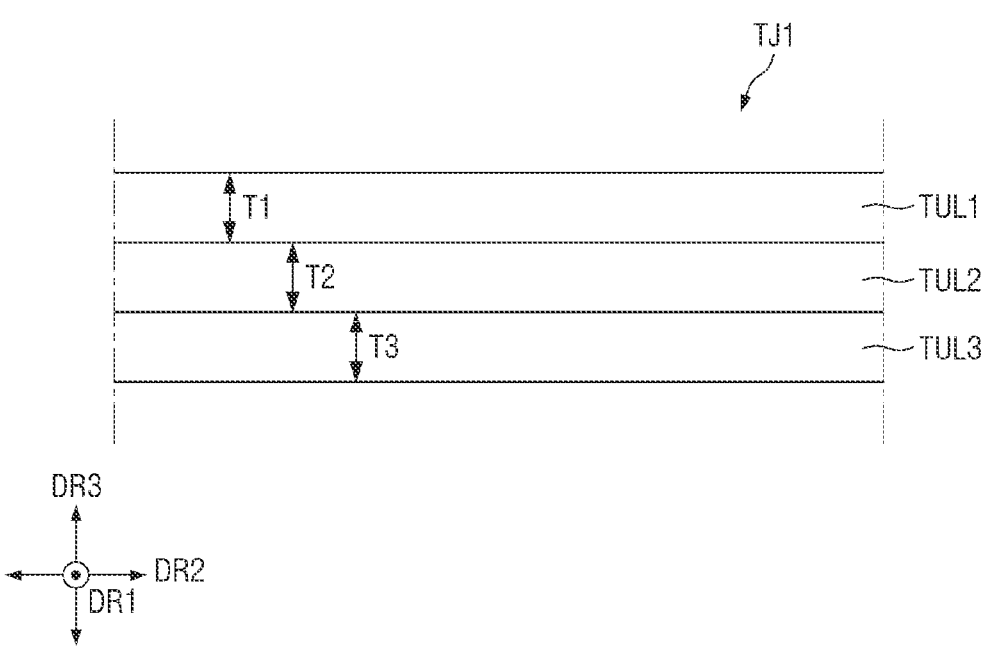
FIG. 8 is a cross-sectional view illustrating a tunnel function layer of a light emitting element according to one or more embodiments of the present disclosure.
Figure 9:
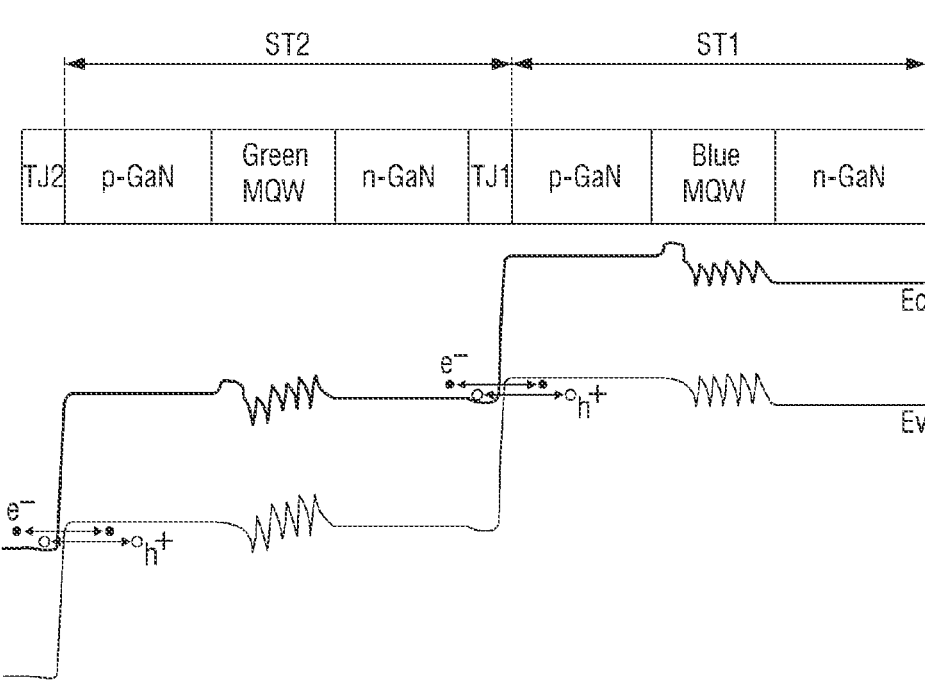
FIG. 9 is a schematic view illustrating movement of electrons and holes in a tunnel function layer of a light emitting element.

FIG. 5 is a cross-sectional view illustrating an example of a display panel taken along the line Q1-Q1' of FIG. 2. FIG. 6 is a cross-sectional view illustrating an example of a display panel taken along the line Q2-Q2' of FIG. 2. FIG. 7 is a cross-sectional view illustrating an example of a light emitting element of a display panel according to one or more embodiments of the present disclosure. FIG. 8 is a cross-sectional view illustrating a tunnel function layer of a light emitting element according to one or more embodiments of the present disclosure. FIG. 9 is a schematic view illustrating movement of electrons and holes in a tunnel function layer of a light emitting element.

Referring to FIGS. 5 to 8, the display panel 10 according to one or more embodiments may include a semiconductor circuit board 100 and a light emitting element layer 120.

The semiconductor circuit board 100 may include a first substrate 110, pixel circuits PXC1, PXC2, and PXC3, a common circuit CAC, pixel electrodes ANO1, ANO2, and ANO3, a common electrode CEP, contact electrodes CAE1, CAE2, CAE3, and CAE4, a first pad PD1, and a circuit insulating layer CINS.

The first substrate 110 may be a silicon wafer substrate formed using a semiconductor process. The first substrate 110 may be made of single crystal silicon.

The plurality of pixel circuits PXC1, PXC2, and PXC3 may be located in the display area DA. The plurality of pixel circuits PXC1, PXC2, and PXC3 may be connected to their corresponding pixel electrodes ANO1, ANO2, and ANO3, respectively. In detail, the plurality of pixel circuits PXC1, PXC2, and PXC3 may include a first pixel circuit PXC1, a second pixel circuit PXC2, and a third pixel circuit PXC3. The first pixel circuit PXC1 may be connected to a first stack ST1 that includes a first active layer MQW1, the second pixel circuit PXC2 may be connected to a second stack ST2 that includes a second active layer MQW2, and the third pixel circuit PXC3 may be connected to a third stack ST3 that includes a third active layer MQW3.

The pixel circuits PXC1, PXC2, and PXC3 may be connected to the pixel electrodes ANO1, ANO2, and ANO3 in one-to-one correspondence. Each of the pixel circuits PXC1, PXC2, and PXC3 may overlap the light emitting element LE in the third direction DR3.

The common circuit CAC may be located in the non-display area NDA. The common circuit CAC may be connected to a first N-type semiconductor layer NSM1 commonly connected to the plurality of light emitting elements LE.

Each of the plurality of pixel circuits PXC1, PXC2, and PXC3 and the common circuit CAC may include at least one transistor formed by a semiconductor process. Also, each of the plurality of pixel circuits PXC1, PXC2, and PXC3 and the common circuit CAC may further include at least one capacitor formed by a semiconductor process. The plurality of pixel circuits PXC1, PXC2, and PXC3 and the common circuit CAC may include, for example, a CMOS circuit. The CMOS circuit is a transistor in which nMOSFET and pMOSFET are combined with each other to improve or maximize their synergy effect, and is advantageous in improving the degree of integration with low power consumption. Each of the plurality of pixel circuits PXC1, PXC2, and PXC3 may apply a pixel voltage or an anode voltage to the pixel electrodes ANO1, ANO2, and ANO3, and the common circuit CAC may apply a common voltage or a cathode voltage to the respective light emitting elements LE.

The circuit insulating layer CINS may be located on the plurality of pixel circuits PXC1, PXC2, and PXC3 and the common circuit CAC. The circuit insulating layer CINS may protect the plurality of pixel circuits PXC1, PXC2, and PXC3 and the common circuit CAC, and may planarize a step difference of the plurality of pixel circuits PXC1, PXC2, and PXC3 and the common circuit CAC. The circuit insulating layer CINS may expose the pixel electrodes ANO1, ANO2, and ANO3 and the common electrode CEP, respectively, so that the pixel electrodes ANO1, ANO2, and ANO3 and the common electrode CEP may be connected to the light emitting element layer 120. The circuit insulating layer CINS may include an inorganic insulating material such as silicon oxide (SiOx), silicon nitride (SiNx), silicon oxynitride (SiOxNy), aluminum oxide (AlxOy), aluminum nitride (AlN), and the like.

The plurality of pixel electrodes ANO1, ANO2, and ANO3 may be located on their corresponding pixel circuits PXC1, PXC2, and PXC3. In detail, the plurality of pixel electrodes ANO1, ANO2, and ANO3 may include a first pixel electrode ANO1, a second pixel electrode ANO2, and a third pixel electrode ANO3. The first pixel electrode ANO1 may be located on the first pixel circuit PXC1, the second pixel electrode ANO2 may be located on the second pixel circuit PXC2, and the third pixel electrode ANO3 may be located on the third pixel circuit PXC3. Each of the pixel electrodes ANO1, ANO2, and ANO3 may be an exposed electrode exposed from the pixel circuits PXC1, PXC2, and PXC3. Each of the pixel electrodes ANO1, ANO2, and ANO3 may be integrally formed with the pixel circuits PXC1, PXC2, and PXC3. Each of the pixel electrodes ANO1, ANO2, and ANO3 may be supplied with a pixel voltage or an anode voltage from the pixel circuits PXC1, PXC2, and PXC3. The pixel electrodes ANO1, ANO2, and ANO3 may include a metal material, such as aluminum (Al).

The common electrode CEP may be located on its corresponding common circuit CAC. The common electrode CEP may be an exposed electrode exposed from the common circuit CAC. The common electrode CEP may be integrally formed with the common circuit CAC. The common electrode CEP may be supplied with a common voltage or a cathode voltage from the common circuit CAC. The common electrode CEP may include a metal material such as aluminum (Al).

The contact electrodes CAE1, CAE2, CAE3, and CAE4 may be located on their corresponding pixel electrodes ANO1, ANO2, and ANO3 and the common electrode CEP. In detail, the contact electrodes CAE1, CAE2, CAE3, and CAE4 may include a first contact electrode CAE1, a second contact electrode CAE2, a third contact electrode CAE3, and a fourth contact electrode CAE4. The first contact electrode CAE1 may be located on the first pixel electrode ANO1, the second contact electrode CAE2 may be located on the second pixel electrode ANO2, and the third contact electrode CAE3 may be located on the third pixel electrode ANO3. In addition, the fourth contact electrode CAE4 may be located on the common electrode CEP.

The contact electrodes CAE1, CAE2, and CAE3 may include a metal material for adhering the pixel electrodes ANO1, ANO2, and ANO3 with the light emitting element LE. For example, the contact electrodes CAE1, CAE2, and CAE3 may include at least one of gold (Au), copper (Cu), aluminum (Al), or tin (Sn). Alternatively, the contact electrodes CAE1, CAE2, and CAE3 may include a first layer that includes any one of gold (Au), copper (Cu), aluminum (Al), and tin (Sn), and a second layer that includes the other one of gold (Au), copper (Cu), aluminum (Al), and tin (Sn).

The fourth contact electrode CAE4 may be located on the common electrode CEP of the non-display area NDA, and may be located to surround the display area DA. The fourth contact electrode CAE4 may be connected to any one of the first pads PD1 of the first pad area PDA1 through the common circuit CAC formed in the non-display area NDA to receive a common voltage. The fourth contact electrode CAE4 may include the same material as that of the contact electrodes CAE1, CAE2, and CAE3 described above. The fourth contact electrode CAE4 may electrically connect a power line of the common circuit CAC with the fourth connection electrode CNE4 of the light emitting element layer 120.

The plurality of first pads PD1 may be located in the first pad area PDA1 in the non-display area NDA. The plurality of first pads PD1 may be located to be spaced apart from the fourth contact electrode CAE4. The plurality of first pads PD1 may be spaced apart from the fourth contact electrode CAE4 toward the outside of the non-display area NDA.

A pad connection electrode PDC may be located on the first pad PD1. The pad connection electrode PDC may be in contact with an upper surface of the first pad PD1. The pad connection electrode PDC may be connected to a circuit pad CPD of the circuit board CB through a conductive connection member, such as a wire WR. That is, the first pad PD1, the pad connection electrode PDC, the wire WR, and the circuit pad CPD of the circuit board CB may electrically be connected to one another.

In one or more other embodiments, the semiconductor circuit board 100 and the circuit board CB may be located on a lower substrate. The semiconductor circuit board 100 and the circuit board CB may be attached to an upper surface of the lower substrate by using an adhesive member, such as a pressure sensitive adhesive.

The circuit board CB may be a flexible printed circuit board (FPCB), a printed circuit board (PCB), a flexible printed circuit (FPC), or a flexible film such as a chip on film (COF).

The light emitting element layer 120 may include a second substrate 210, light emitting elements LE, and connection electrodes CNE1, CNE3, CNE3, and CNE4.

The second substrate 210 may face the first substrate 110 of the semiconductor circuit board 100. The second substrate 210 may support each light emitting element LE. The second substrate 210 may include a transparent substrate, such as a sapphire substrate ($Al_2O_3$), silicon (Si), glass, and the like, but is not limited thereto. The second substrate 210 may be formed of a conductive substrate, such as GaN, SiC, ZnO, Si, GaP, and GaAs. Hereinafter, the case that the second substrate 210 is a sapphire substrate ($Al_2O_3$) will be described by way of example. Although there is no special limitation in a thickness of the second substrate 210, the second substrate 210 may have a thickness ranging from about 400 μm to about 1500 μm.

The light emitting element LE may be located on one surface of the second substrate 210. The light emitting element LE may be located on a lower surface of the second substrate 210 facing the first substrate 110. The light emitting element LE may include a first stack ST1 that includes a first active layer MQW1 for emitting first light, a second stack ST2 that includes a second active layer MQW2 for emitting second light, and a third stack ST3 that includes a third active layer MQW3 for emitting third light. The light emitting element LE may include a first light emission area EA1 through which the first light is emitted, a second light emission area EA2 through which the second light is emitted, and a third light emission area EA3 through which the third light is emitted. The first light emission area EA1 may be partitioned by a planar size of the first stack ST1, the second light emission area EA2 may be partitioned by a planar size of the second stack ST2, and the third light emission area EA3 may be partitioned by a planar size of the third stack ST3. In this case, the size of the first light emission area EA1 may be larger than that of the second light emission area EA2, and the size of the second light emission area EA2 may be larger than that of the third light emission area EA3.

The light emitting element LE may be a vertical light emitting diode element extended in the third direction DR3. In one or more embodiments, a length of the light emitting element LE in the third direction DR3 may be shorter than that in a horizontal direction. The length in the horizontal direction indicates the length in the first direction DR1 or the length in the second direction DR2. For example, the length of the light emitting element LE in the third direction DR3 may be about 1 μm to about 5 μm, approximately, but is not limited thereto. The length of the light emitting element LE in the third direction DR3 may be longer than that in the horizontal direction.

As shown in FIGS. 5 and 6, the light emitting element LE may be formed in a shape in which plates having different sizes are stacked with each other, but is not limited thereto. The light emitting element LE may have a cylindrical shape, a disk shape, and a rod shape, or may have various shapes such as a shape of a wire and a tube, a polygonal pillar shape of a cube, a cuboid, and a hexagonal pillar, or a shape extended in one direction, having an external surface that is partially inclined.

The light emitting element LE may be a micro light emitting diode element. The light emitting element LE may include a first stack ST1, a second stack ST2, and a third stack ST3, which are located in a direction oriented from the second substrate 210 toward the first substrate 110 (i.e., a direction opposite to the third direction DR3).

Referring to FIGS. 6 and 7, the first stack ST1 may include a first active layer MQW1 that emits first light. In detail, the first stack ST1 may include a first n-type semiconductor layer NSM1, a first p-type semiconductor layer PSM1, and a first active layer MQW1 interposed the first n-type semiconductor layer NSM1 and the first p-type semiconductor layer PSM1.

The first n-type semiconductor layer NSM1 may be located on one surface of the second substrate 210, and may be an n-type semiconductor. The first n-type semiconductor layer NSM1 may include a semiconductor material having a chemical formula of AlxGayIn1-x-yN (0≤x≤1, 0≤y≤1, 0≤x+y≤1). For example, the first n-type semiconductor layer NSM1 may be any one or more of AlGaInN, GaN, AlGaN, InGaN, AlN, and InN, which are doped with n-type. The first n-type semiconductor layer NSM1 may be doped with an n-type dopant, and the n-type dopant may be Si, Ge, Sn, etc. For example, the first n-type semiconductor layer NSM1 may be n-GaN doped with n-type Si. The first n-type semiconductor layer NSM1 may have a thickness ranging from about 2 μm to about 4 μm, but is not limited thereto.

The first n-type semiconductor layer NSM1 may be located to be continuously extended to the plurality of light emitting elements LE. For example, the first n-type semiconductor layer NSM1 may be a common layer located in the plurality of light emitting elements LE, and may act as a common electrode.

The first active layer MQW1 may be located on one surface of the first n-type semiconductor layer NSM1. The first active layer MQW1 may be located on a lower surface, which is oriented toward the first substrate 110, in the first n-type semiconductor layer NSM1. The first active layer MQW1 may emit light by combination of electron-hole pairs in accordance with electrical signals applied through the first n-type semiconductor layer NSM1 and the first p-type semiconductor layer PSM1. The first active layer MQW1 may emit first light having a central wavelength band ranging from about 450 nm to about 495 nm, that is, light of a blue wavelength band.

The first active layer MQW1 may include a single or multiple quantum well structure material. When the first active layer MQW1 includes a multiple quantum well structure material, a plurality of well layers, and a plurality of barrier layers may alternately be stacked. In this case, the well layer may be formed of, but is not limited to, InGaN, and the barrier layer may be formed of, but is not limited to, GaN or AlGaN. A thickness of the well layer may be about 1 nm to about 4 nm, approximately, and a thickness of the barrier layer may be about 3 nm to about 10 nm, approximately.

Alternately, the first active layer MQW1 may have a structure in which semiconductor materials having a high band gap energy and semiconductor materials having a low band gap energy are alternately stacked, and may include different group III to group V semiconductor materials depending on a wavelength range of light that is emitted. The light emitted from the first active layer MQW1 is not limited to the first light, and the first active layer MQW1 may emit second light (light of a green wavelength band) or third light (light of a red wavelength band) as the case may be.

The first p-type semiconductor layer PSM1 may be located on one surface of the first active layer MQW1. The first p-type semiconductor layer PSM1 may be located on a lower surface, which is oriented toward the first substrate 110, in the first active layer MQW1. The first p-type semiconductor layer PSM1 may be a p-type semiconductor, and may include a semiconductor material having a chemical formula of AlxGayIn1-x-yN (0≤x≤1, 0≤y≤1, 0≤x+y≤1). For example, the first p-type semiconductor layer PSM1 may be any one or more of AlGaInN, GaN, AlGaN, InGaN, AlN, and InN, which are doped with p-type. The first p-type semiconductor layer PSM1 may be doped with a p-type dopant, and the p-type dopant may be Mg, Zn, Ca, Sr, Ba, or the like. For example, the first p-type semiconductor layer PSM may be p-GaN doped with p-type Mg. A thickness of the first p-type semiconductor layer PSM1 may range from about 30 μm to about 200 μm, but is not limited thereto.

The second stack ST2 may include a second active layer MQW2 that emits second light. In detail, the second stack ST2 may include a second n-type semiconductor layer NSM2, a second p-type semiconductor layer PSM2, and a second active layer MQW2 interposed between the second n-type semiconductor layer and the second p-type semiconductor layer PSM2.

The second n-type semiconductor layer NSM2 may be located below the first stack ST1. The second n-type semiconductor layer NSM2 may be an n-type semiconductor layer for supplying electrons to the second active layer MQW2. The second n-type semiconductor layer NSM2 may include the same material as that of the first n-type semiconductor layer NSM1, and may have substantially the same thickness.

The second active layer MQW2 may be located on a lower surface of the second n-type semiconductor layer NSM2. The second active layer MQW2 may emit light by combination of electron-hole pairs in accordance with electrical signals applied through the second n-type semiconductor layer NSM2 and the second p-type semiconductor layer PSM2. The second active layer MQW2 may emit second light having a central wavelength band of about 510 nm to about 550 nm, that is, light of a green wavelength band.

The second active layer MQW2 may include the same material as that of the first active layer MQW1. However, the second active layer MQW2 may have a variable component rate to emit the second light. For example, when the first active layer MQW1, the second active layer MQW2, and the third active layer MQW3 include InGaN, a color of light that is emitted may be varied depending on a content of indium (In). For example, as the content of indium (In) is increased, a wavelength band of the light emitted from the active layer may move to a red wavelength band, and as the content of indium (In) is reduced, the wavelength band of the light emitted from the active layer may move to a blue wavelength band.

Therefore, the content of indium (In) in the first active layer MQW1 may be lower than the content of indium (In) in each of the second active layer MQW2 and the third active layer MQW3. In addition, the content of indium (In) in the second active layer MQW2 may be lower than that of indium (In) in the third active layer MQW3. That is, the content of indium (In) in the third active layer MQW3 may be greater than that of indium (In) in the second active layer MQW2, and the content of indium (In) in the second active layer MQW2 may be greater than that of indium (In) in the first active layer MQW1. For example, the content of indium (In) in the first active layer MQW1 may be about 10% to about 20%, approximately, the content of indium (In) in the second active layer MQW2 may be about 20% to about 30%, approximately, and the content of indium (In) in the third active layer MQW3 may be about 30% to about 45%, approximately. That is, the content of indium (In) in the active layers may be adjusted, whereby the active layers MQW1, MQW2, and MQW3 may emit light of different colors.

The second p-type semiconductor layer PSM2 may be located on a lower surface of the second active layer MQW2. The second p-type semiconductor layer PSM2 may be a p-type semiconductor layer that supplies holes to the second active layer MQW2. The second p-type semiconductor layer PSM2 may include the same material as that of the first p-type semiconductor layer PSM1, and may have substantially the same thickness.

The third stack ST3 may include a third active layer MQW3 that emits third light. In detail, the third stack ST3 may include a third n-type semiconductor layer NSM3, a third p-type semiconductor layer PSM3, and a third active layer MQW3 interposed between the third n-type semiconductor layer NSM3 and the third p-type semiconductor layer PSM3.

The third n-type semiconductor layer NSM3 may be located below the second stack ST2. The third n-type semiconductor layer NSM3 may be an n-type semiconductor layer that supplies electrons to the third active layer MQW3. The third n-type semiconductor layer NSM3 may include the same material as that of the first n-type semiconductor layer NSM1, and may have substantially the same thickness.

The third active layer MQW3 may be located on a lower surface of the third n-type semiconductor layer NSM3. The third active layer MQW3 may emit light by combination of electron-hole pairs in accordance with electrical signals applied through the third n-type semiconductor layer NSM3 and the third p-type semiconductor layer PSM3. The third active layer MQW3 may emit third light having a central wavelength band of about 610 nm to about 650 nm, that is, light of a red wavelength band.

The third active layer MQW3 may include the same material as that of the first active layer MQW1 and/or the second active layer MQW2. However, the third active layer MQW3 may have a variable component rate to emit the third light. For example, when the third active layer MQW3 includes InGaN, the content of indium (In) in the third active layer MQW3 may be about 30% to about 45%.

The third p-type semiconductor layer PSM3 may be located on a lower surface of the third active layer MQW3. The third p-type semiconductor layer PSM3 may be a p-type semiconductor layer that supplies holes to the third active layer MQW3. The third p-type semiconductor layer PSM3 may include the same material as that of the first p-type semiconductor layer PSM1 and/or the second p-type semiconductor layer PSM2, and may have substantially the same thickness.

The light emitting element LE according to one or more embodiments of the present disclosure may be formed in a structure in which three stacks ST1, ST2, and ST3, which respectively include three different active layers MQW1, MQW2, and MQW3, are vertically stacked. Electrons and holes cannot move in a place where the p-type semiconductor layer and the n-type semiconductor layer of each of the stacks ST1, ST2, and ST3 are in contact with each other, whereby the light emitting element LE may not emit light.

In the present embodiments, tunnel function layers TJ1 and TJ2 may be located among the stacks ST1, ST2, and ST3 of the light emitting element LE to move electrons and holes to the stacks ST1, ST2, and ST3 adjacent thereto.

Referring to FIGS. 7 and 8, the tunnel function layers TJ1 and TJ2 may be respectively located between the first stack ST1 and the second stack ST2, and between the second stack ST2 and the third stack ST3. The tunnel function layers TJ1 and TJ2 may include a first tunnel function layer TJ1 and a second tunnel function layer TJ2.

The first tunnel function layer TJ1 may be located between the first stack ST1 and the second stack ST2. The second tunnel function layer TJ2 may be located between the second stack ST2 and the third stack ST3. Each of the tunnel function layers TJ1 and TJ2 may include a first tunnel layer TUL1, a second tunnel layer TUL2 and a third tunnel layer TUL3, as shown in FIG. 8.

The first tunnel layer TUL1 may be an n-type semiconductor layer. The first tunnel layer TUL1 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first tunnel layer TUL1 may be any one or more of AlGaInN, GaN, AlGaN, InGaN, AlN, and InN, which are doped with n-type. The first tunnel layer TUL1 may be doped with an n-type dopant, and the n-type dopant may be Te, Si, Ge, Sn, C, etc. For example, the first tunnel layer TUL1 may be an n-GaN doped with n-type Si. The n-type dopant doped in the first tunnel layer TUL1 may be doped at a concentration of about $2 \times 10^{20}/cm^3$ to about $2 \times 10^{21}/cm^3$, but is not limited thereto. A thickness T1 of the first tunnel layer TUL1 may range from about 1 nm to about 50 nm, but is not limited thereto.

The second tunnel layer TUL2 may be an n-type semiconductor layer. The second tunnel layer TUL2 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second tunnel layer TUL2 may be any one or more of AlGaInN, GaN, AlGaN, InGaN, AlN, and InN, which are doped with n-type. The second tunnel layer TUL2 may be doped with an n-type dopant, and the n-type dopant may be Te, Si, Ge, Sn, C, etc. For example, the second tunnel layer TUL2 may be n-InGaN doped with n-type Si. The n-type dopant doped in the second tunnel layer TUL2 may be doped at a concentration of about $2 \times 10^{20}/cm^3$ to about $2 \times 10^{21}/cm^3$, but is not limited thereto. A thickness T2 of the second tunnel layer TUL2 may range from about 1 nm to about 5 nm, but is not limited thereto. In one or more embodiments, the thickness of the second tunnel layer TUL2 may be less than that of each of the first tunnel layer TUL1 and the third tunnel layer TUL3.

The third tunnel layer TUL3 may be a p-type semiconductor layer. The third tunnel layer TUL3 may include a semiconductor material having a chemical formula of $Al_xGa_yIn_{1-x-y}N$ ($0 \leq x \leq 1$, $0 \leq y \leq 1$, $0 \leq x+y \leq 1$). For example, the third tunnel layer TUL3 may be any one or more of AlGaInN, GaN, AlGaN, InGaN, AlN, and InN, which are doped with p-type. The third tunnel layer TUL3 may be doped with a p-type dopant, and the p-type dopant may be Mg, Zn, Ca, Se, Ba, Be, etc. For example, the third tunnel layer TUL3 may be p-GaN doped with p-type Mg. The p-type dopant doped in the third tunnel layer TUL3 may be doped at a concentration of about $5\times10^{18}/cm^3$ to about $5\times10^{19}/cm^3$, but is not limited thereto. A thickness T3 of the third tunnel layer TUL3 may range from about 1 nm to about 50 nm, but is not limited thereto.

In one or more embodiments, the concentration of the p-type dopant doped in the third tunnel layer TUL3 may be lower than the concentration of the n-type dopant doped in the first tunnel layer TUL1 and may be lower than the concentration of the n-type dopant doped in the second tunnel layer TUL2. In addition, the concentration of the n-type dopant doped in the first tunnel layer TUL1 and the concentration of the n-type dopant doped in the second tunnel layer TUL2 may be substantially the same as each other.

The respective first tunnel layers TUL1 may be located in contact with the p-type semiconductor layers PSM1 and PSM2, and the respective third tunnel layers TUL3 may be located in contact with the n-type semiconductor layers NSM2 and NSM3. The second tunnel layer TUL2 may be located in contact with each of the first tunnel layer TUL1 and the third tunnel layer TUL3 while being between the first tunnel layer TUL1 and the third tunnel layer TUL3. That is, the first tunnel layer TUL1, the second tunnel layer TUL2, and the third tunnel layer TUL3 may sequentially be stacked so that adjacent layers may be located in contact with each other.

In one or more embodiments, the first tunnel layer TUL1 of the first tunnel function layer TJ1 may be located in contact with the first p-type semiconductor layer PSM1 of the first stack ST1, and the third tunnel layer TUL3 may be located in contact with the second n-type semiconductor layer NSM2 of the second stack ST2. The first tunnel layer TUL1 of the second tunnel function layer TJ2 may be located in contact with the second p-type semiconductor layer PSM2 of the second stack ST2, and the third tunnel layer TUL3 may be located in contact with the third n-type semiconductor layer NSM3 of the third stack ST3.

The tunnel function layers TJ1 and TJ2 may respectively move electrons and holes to the respective stacks ST1, ST2, and ST3 adjacent thereto.

FIG. 9 illustrates a schematic view of an energy band of a light emitting element LE. When a positive voltage is applied to a p-type semiconductor in a general pn junction and a negative voltage is applied to an n-type semiconductor (forward voltage), as electrons move from a conduction band Ec of the n-type semiconductor to a p-type, and holes move from a valence band Ev of the p-type semiconductor to an n-type, the electrons meet the holes on a pn junction interface, whereby recombination occurs.

On the other hand, when a negative voltage is applied to the p-type semiconductor and a positive voltage is applied to the n-type semiconductor (reverse voltage), energy of the valence band of the p-type semiconductor is higher than that of the conduction band of the n-type semiconductor, whereby internal electrons of the valence band of the p-type semiconductor may move to the conduction band of the n-type semiconductor. Such a phenomenon may occur in several conditions, and as the first condition, the doping concentration of the semiconductor should be suitably high, and as the second condition, the thickness of the semiconductor should be suitably thin.

In the present embodiments, the tunnel function layers TJ1 and TJ2 include a first tunnel layer TUL1 that is an n-type semiconductor layer, a second tunnel layer TUL2 that is an n-type semiconductor layer, and a third tunnel layer TUL3 that is a p-type semiconductor layer. In addition, the doping concentration of the dopant of the first tunnel layer TUL1 and the second tunnel layer TUL2 is in the range of about $2\times10^{20}/cm^3$ to about $2\times10^{21}/cm^3$ and the doping concentration of the dopant of the third tunnel layer TUL3 is relatively very high in the range of about $5\times10^{18}/cm^3$ to about $5\times10^{19}/cm^3$. Also, the thicknesses T1, T2, and T3 of the first tunnel layer TUL1, the second tunnel layer TUL2, and the third tunnel layer TUL3 are relatively very thin to be less than about several tens of nanometers.

As a result, the tunnel function layers TJ1 and TJ2 according to some embodiments satisfy the above-mentioned conditions, thereby enabling movement of electrons and holes between the first p-type semiconductor layer PSM1 of the first stack ST1 and the second n-type semiconductor layer NSM2 of the second stack ST2 and between the second p-type semiconductor layer PSM2 of the second stack ST2 and the third n-type semiconductor layer NSM3 of the third stack ST3.

Therefore, recombination of the electrons and holes may occur in the active layers MQW1, MQW2, and MQW3 of the respective stacks ST1, ST2, and ST3 inside the light emitting element LE in which the first stack ST1, the second stack ST2, and the third stack ST3 are stacked, whereby light may be emitted.

Meanwhile, in one or more embodiments, the light emitting element LE may further include an electron blocking layer. The electron blocking layer may be located between the active layer and the p-type semiconductor layer in each of the stacks ST1, ST2, and ST3. The electron blocking layer may be a layer for suppressing or preventing too many electrons from flowing to the active layer. For example, the electron blocking layer may be p-AlGaN doped with p-type Mg. A thickness of the electron blocking layer may range from about 10 nm to about 50 nm, but is not limited thereto. The electron blocking layer may be omitted.

Referring back to FIG. 6, the light emitting element layer 120 may include a plurality of connection electrodes CNE1, CNE2, and CNE3. The light emitting element layer 120 may include a first connection electrode CNE1, a second connection electrode CNE2, and a third connection electrode CNE3. The first connection electrode CNE1 may connect the first stack ST1 of the light emitting element LE to the first contact electrode CAE1. The first connection electrode CNE1 may overlap the first stack ST1 and the first contact electrode CAE1, and may be in contact with each of the first stack ST1 and the first contact electrode CAE1. The first connection electrode CNE1 may be in contact with the first p-type semiconductor layer PSM1 of the first stack ST1. The first connection electrode CNE1 may supply an anode voltage to allow the first active layer MQW1 of the first stack ST1 to emit light.

The second connection electrode CNE2 may connect the second stack ST2 of the light emitting element LE to the second contact electrode CAE2. The second connection electrode CNE2 may overlap the second stack ST2 and the second contact electrode CAE2, and may be in contact with each of the second stack ST2 and the second contact electrode CAE2. The second connection electrode CNE2 may be in contact with the second p-type semiconductor layer PSM2 of the second stack ST2. The second connection electrode CNE2 may supply an anode voltage to allow the second active layer MQW2 of the second stack ST2 to emit light.

The third connection electrode CNE3 may connect the third stack ST3 of the light emitting element LE to the third contact electrode CAE3. The third connection electrode CNE3 may overlap the third stack ST3 and the third contact electrode CAE3, and may be in contact with each of the third stack ST3 and the third contact electrode CAE3. The third connection electrode CNE3 may be in contact with the third p-type semiconductor layer PSM3 of the third stack ST3. The third connection electrode CNE3 may supply an anode voltage to allow the third active layer MQW3 of the third stack ST3 to emit light.

Each of the connection electrodes CNE1, CNE2, and CNE3 may be an ohmic connection electrode, but is not limited thereto. Each of the connection electrodes CNE1, CNE2, and CNE3 may be a Schottky connection electrode. When the light emitting element LE is electrically connected to the contact electrode in the display device 1 according to one or more embodiments of the present disclosure, resistance between the light emitting element LE and the contact electrode may be reduced. Each of the connection electrodes CNE1, CNE2, and CNE3 may include a conductive metal. For example, each of the connection electrodes CNE1, CNE2, and CNE3 may include at least one of gold (Au), copper (Cu), tin (Sn), titanium (Ti), aluminum (Al), or silver (Ag). For example, each of the connection electrodes CNE1, CNE2, and CNE3 may include a 9:1 alloy, an 8:2 alloy, or a 7:3 alloy of gold and tin, or may include an alloy SAC305 of copper, silver, and tin.

A distance D1 between the first stack ST1 of the light emitting element LE and the semiconductor circuit board 100 may be greater than a distance D2 between the second stack ST2 and the semiconductor circuit board 100, and may be greater than a distance D3 between the third stack ST3 and the semiconductor circuit board 100. In this case, the distance between each of the stacks ST1, ST2, and ST3 and the semiconductor circuit board 100 means a distance between the p-type semiconductor layers PSM1, PSM2, and PSM3 of the respective stacks ST1, ST2, and ST3 and the contact electrodes CAE1, CAE2, and CAE3 of the semiconductor circuit board 100. In addition, the distance D2 between the second stack ST2 and the semiconductor circuit board 100 may be less than the distance D1 between the first stack ST1 and the semiconductor circuit board 100, and may be greater than the distance D3 between the third stack ST3 and the semiconductor circuit board 100. The distance D3 between the third stack ST3 and the semiconductor circuit board 100 may be less than the distance D1 between the first stack ST1 and the semiconductor circuit board 100, and may be less than the distance D2 between the second stack ST2 and the semiconductor circuit board 100.

Therefore, the thicknesses of the connection electrodes CNE1, CNE2, and CNE3, which are respectively the same as the respective distances between the stacks ST1, ST2, and ST3 and the semiconductor circuit board 100, may have a large-to-small relationship. For example, the thickness of the first connection electrode CNE1 may be greater than that of each of the second connection electrode CNE2 and the third connection electrode CNE3. The thickness of the second connection electrode CNE2 may be greater than that of the third connection electrode CNE3.

The common connection electrode CNE4 may be located in the common electrode connecting portion CPA of the non-display area NDA. The common connection electrode CNE4 may be located on one surface of the first n-type semiconductor layer NSM1 of the first stack ST1 of the light emitting element LE extended from the display area DA to the non-display area NDA. The common connection electrode CNE4 may serve to transfer the common voltage of the light emitting elements LE from the fourth contact electrode CAE4. The common connection electrode CNE4 may be made of the same material as that of the connection electrodes CNE1, CNE2, and CNE3. To connect the common connection electrode CNE4 to the fourth contact electrode CAE4, the common connection electrode CNE4 may be thicker in the third direction DR3. The thickness of the common connection electrode CNE4 may be greater than that of each of the connection electrodes CNE1, CNE2, and CNE3.

The light emitting element LE may allow the active layers MQW1, MQW2, and MQW3 respectively included in the stacks ST1, ST2, and ST3 to individually emit light. For example, the first active layer MQW1 of the first stack ST1 may supply a cathode voltage to the first n-type semiconductor layer NSM1 of the first stack ST1 through the common connection electrode CNE4, and may supply an anode voltage to the first p-type semiconductor layer PSM1 through the first connection electrode CNE1 to emit light. The second active layer MQW2 of the second stack ST2 may supply a cathode voltage to the second n-type semiconductor layer NSM2 of the second stack ST2 through the first connection electrode CNE1, and may supply an anode voltage to the second p-type semiconductor layer PSM2 through the second connection electrode CNE2 to emit light. In this case, the cathode voltage supplied by the first connection electrode CNE1 (e.g., the anode voltage to the first p-type semiconductor layer PSM1) may be supplied to the second n-type semiconductor layer NSM2 through the first tunnel function layer TJ1. In addition, the third active layer MQW3 of the third stack ST3 may supply a cathode voltage to the third n-type semiconductor layer NSM3 of the third stack ST3 through the second connection electrode CNE2, and may supply an anode voltage to the third p-type semiconductor layer PSM3 through the third connection electrode CNE3 to emit light. In this case, the cathode voltage supplied by the second connection electrode CNE2 may be supplied to the third n-type semiconductor layer NSM3 through the second tunnel function layer TJ2.

In addition, the light emitting element LE may allow the active layers MQW1, MQW2, and MQW3 included in the respective stacks ST1, ST2, and ST3 to emit light at the same time. In this case, voltages may be applied to both the connection electrodes CNE1, CNE2, and CNE3 and the common connection electrode CNE4, and their magnitudes may be different from one another. For example, when the voltage applied to the third connection electrode CNE3 is V1, the voltage applied to the second connection electrode CNE2 is V2, the voltage applied to the first connection electrode CNE1 is V3, and the voltage applied to the common connection electrode CNE4 is V4, the magnitudes of the voltages V1, V2, V3 and V4 may have a relationship of V4<V3<V2<V1. That is, the magnitudes of the voltage applied to the connection electrodes CNE1, CNE2, CNE3, and CNE4 may be adjusted to have a voltage difference, whereby the active layers MQW1, MQW2, and MQW3 of each of the stacks ST1, ST2, and ST3 may emit light at the same time.

As described above, in the display device 1 according to one or more embodiments of the present disclosure, the tunnel function layers TJ1 and TJ2 may be located among the plurality of stacks ST1, ST2, and ST3 of the light emitting element LE to enable movement of electrons and holes among the stacks ST1, ST2, and ST3, whereby the respective stacks ST1, ST2, and ST3 of the light emitting element LE may emit light. Therefore, blue, green, and red light may be emitted from one light emitting element LE, so that a plurality of subpixels may be omitted, and so that one pixel PX may be configured by one light emitting element LE. Therefore, the structure and the manufacturing process of the display device 1 may be simplified, and the display device 1 of high resolution may be implemented.

In addition, the connection electrodes CNE1, CNE2, CNE3, and CNE4 may respectively be located in the plurality of stacks ST1, ST2, and ST3 of the light emitting element LE, whereby the plurality of stacks ST1, ST2, and ST3 may emit light individually, concurrently, or substantially simultaneously. In addition, a period for applying a current in each of the stacks ST1, ST2, and ST3 may be adjusted to represent a gray scale, whereby a full color may be implemented.

Hereinafter, a display device 1 according to one or more other embodiments will be described with reference to other drawings.

Figure 10:
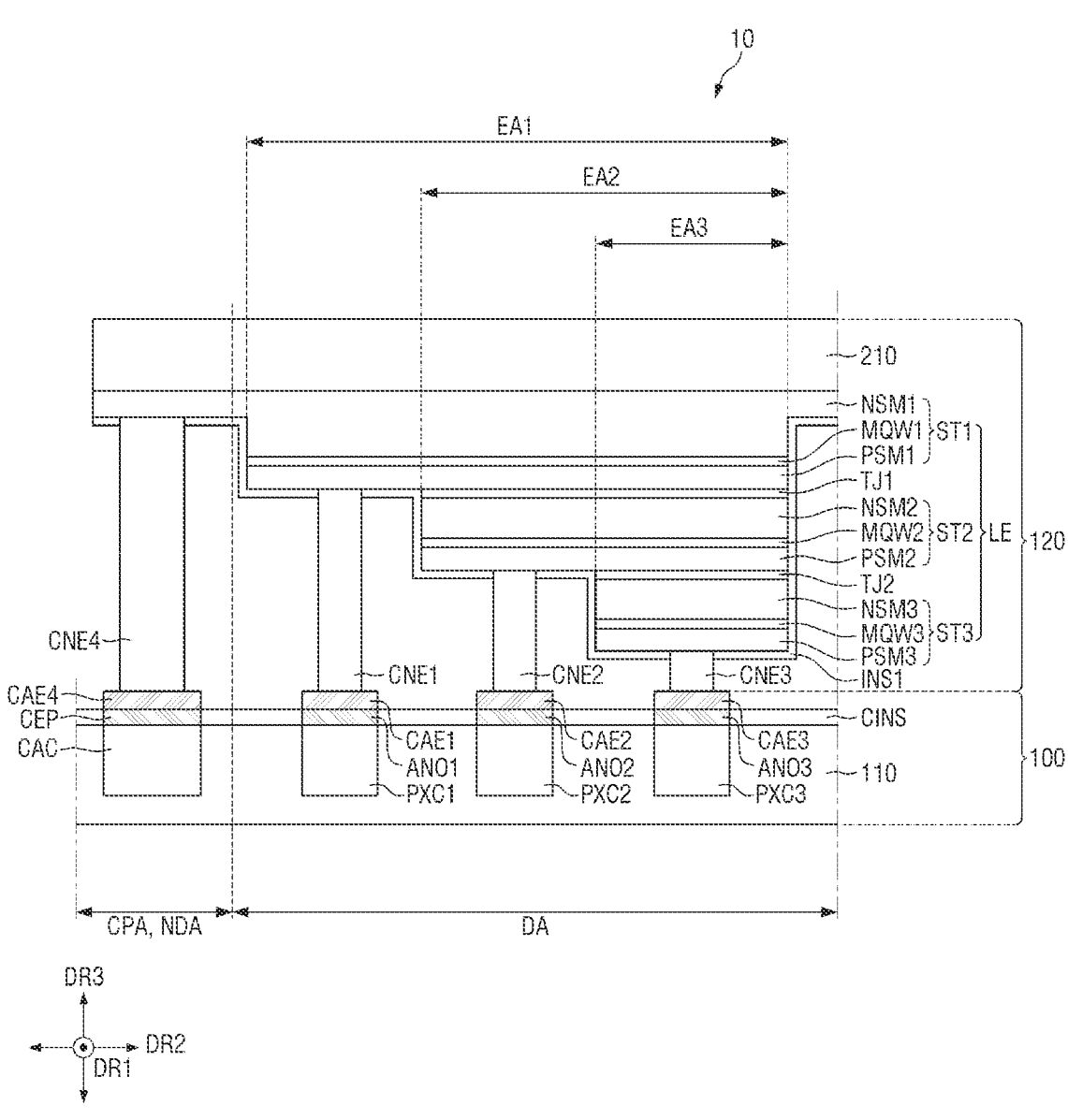
FIG. 10 is a cross-sectional view illustrating a display device according to one or more other embodiments of the present disclosure.
Figure 11:
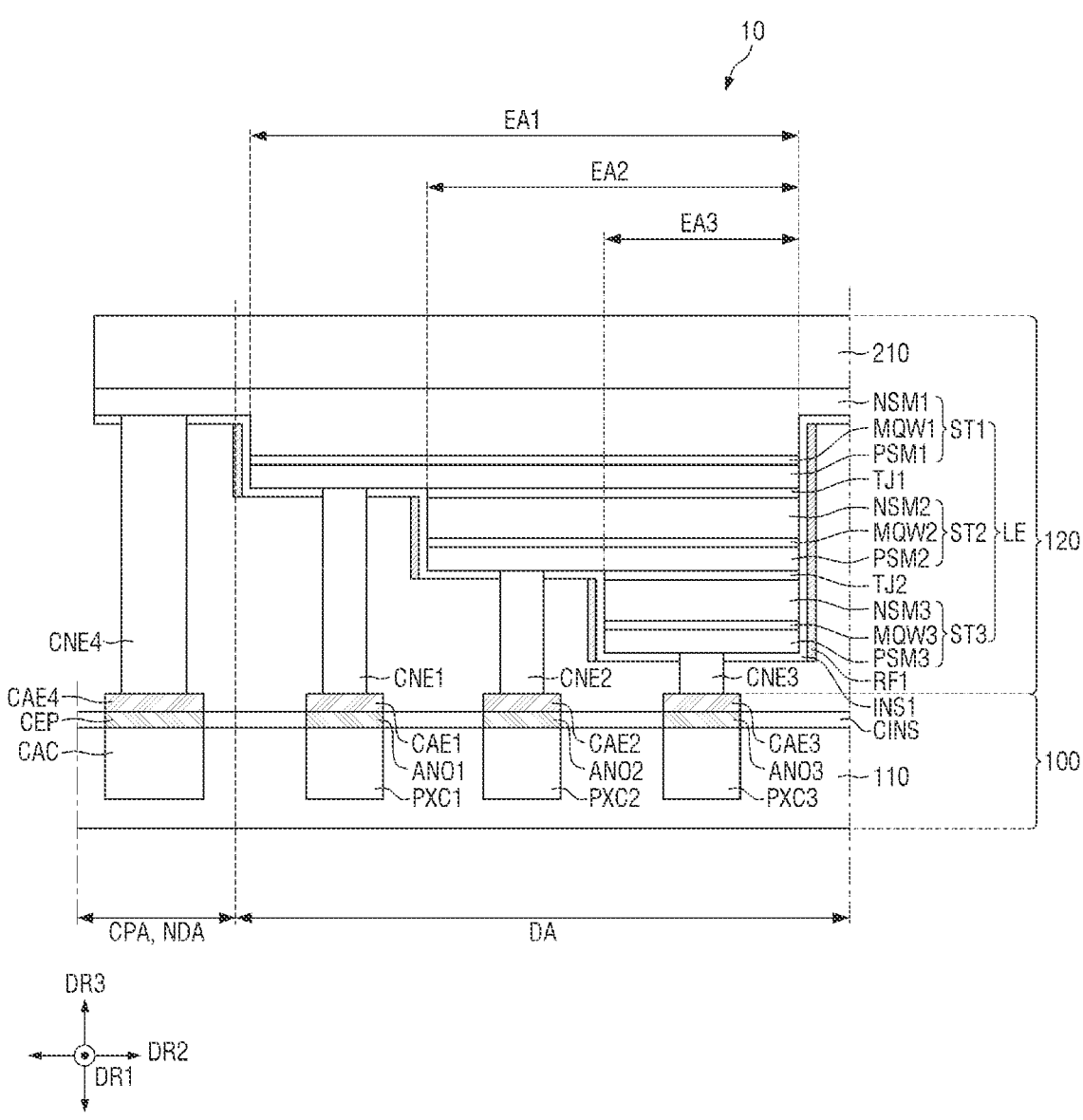
FIG. 11 is a cross-sectional view illustrating a display device according to one or more other embodiments of the present disclosure.

FIG. 10 is a cross-sectional view illustrating a display device according to one or more other embodiments of the present disclosure. FIG. 11 is a cross-sectional view illustrating a display device according to one or more other embodiments of the present disclosure.

Referring to FIG. 10, the present embodiments are different from the embodiments corresponding to FIGS. 5 to 9 in that the display device 1 according to the present embodiments further includes an insulating layer INS1 on one surface of the light emitting element layer 120. Hereinafter, the description of the same elements as those of FIGS. 5 to 9 will be omitted, and a difference from FIGS. 5 to 9 will be described in detail.

The light emitting element layer 120 may further include an insulating layer INS1. The insulating layer INS1 may be located on a lower surface and sides of the light emitting element LE. The insulating layer INS1 may insulate the light emitting elements LE, which are adjacent to each other, from each other. In detail, the insulating layer INS1 may be located directly on a lower surface and a side of the first n-type semiconductor layer NSM1 of the first stack ST1, may be located directly on a side of the first active layer MQW1, and may be located directly on a lower surface and a side of the first p-type semiconductor layer PSM1. In addition, the insulating layer INS1 may be directly located on a side of the first tunnel function layer TJ1, a side of the second n-type semiconductor layer NSM2 of the second stack ST2, a side of the second active layer MQW2, and a side and a lower surface of the second p-type semiconductor layer PSM2. Also, the insulating layer INS1 may be directly located on a side of the second tunnel function layer TJ2, a side of the third n-type semiconductor layer NSM3 of the third stack ST3, a side of the third active layer MQW3, and a side and a lower surface of the third p-type semiconductor layer PSM3.

The insulating layer INS1 may expose a portion of the lower surfaces of the first p-type semiconductor layer PSM1, the second p-type semiconductor layer PSM2, and the third p-type semiconductor layer PSM3 of the light emitting element LE to contact the connection electrodes CNE1, CNE2, and CNE3. In addition, the insulating layer INS1 may expose a portion of the lower surfaces of the first n-type semiconductor layer NSM1 of the light emitting element layer 120 in the non-display area NDA to contact the common connection electrode CNE4.

The insulating layer INS1 may include an inorganic insulating material such as silicon oxide (SiOx), silicon nitride (SiNx), silicon oxynitride (SiOxNy), aluminum oxide (AlxOy), and aluminum nitride (AlN). A thickness of the insulating layer INS1 may be about 0.1 μm, approximately, but is not limited thereto.

Meanwhile, referring to FIG. 11, in the present embodiments, a reflective layer RF1 may be further included on the side of the insulating layer INS1.

The reflection layer RF1 serves to reflect light moving to left and right sides, as opposed to an upper direction, among the light emitted from the light emitting element LE. The reflection layer RF1 may be located in the display area DA. The reflective layer RF1 may be located to correspond to a side of the light emitting element LE. In detail, the reflective layer RF1 may be located on the insulating layer INS1 to correspond to a side of the first stack ST1, a side of the second stack ST2, and a side of the third stack ST3. The reflective layer RF1 may be omitted from the lower surface of each of the stacks ST1, ST2, and ST3, so as to be spaced apart from the connection electrodes CNE1, CNE2, and CNE3 and the common connection electrode CNE4.

The reflective layer RF1 may include a metal material having high reflectance, such as aluminum (Al). A thickness of the reflective layer RF1 may be about 0.1 μm, approximately, but is not limited thereto.

Figure 12:
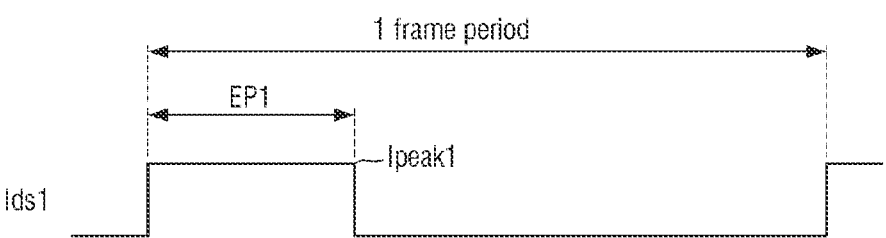
FIG. 12 is a waveform diagram illustrating a first driving current applied to a first stack of a light emitting element according to one or more embodiments of the present disclosure.
Figure 13:
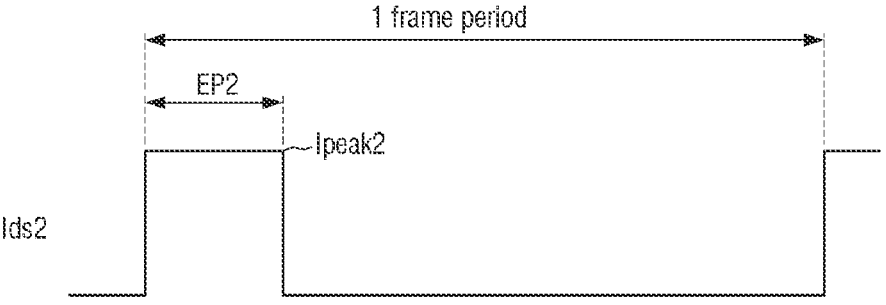
FIG. 13 is a waveform diagram illustrating a second driving current applied to a second stack of a light emitting element according to one or more embodiments of the present disclosure.
Figure 14:
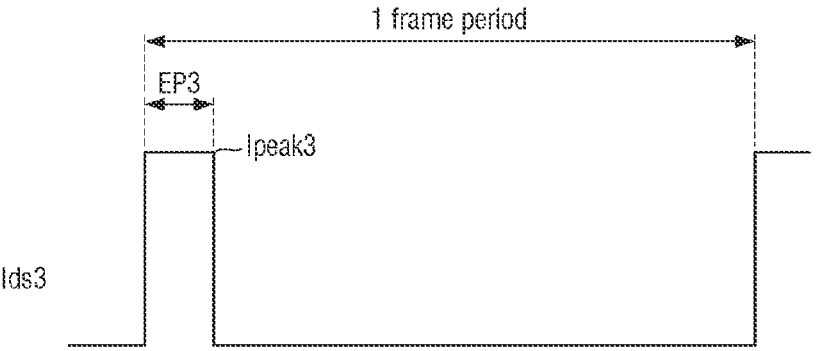
FIG. 14 is a waveform diagram illustrating a third driving current applied to a third stack of a light emitting element according to one or more embodiments of the present disclosure.

FIG. 12 is a waveform illustrating a first driving current applied to a first stack of a light emitting element according to one or more embodiments of the present disclosure. FIG. 13 is a waveform illustrating a second driving current applied to a second stack of a light emitting element according to one or more embodiments of the present disclosure. FIG. 14 is a waveform illustrating a third driving current applied to a third stack of a light emitting element according to one or more embodiments of the present disclosure.

In FIGS. 12 to 14, a first driving current Ids1 applied to the first stack ST1 of the light emitting element LE, a second driving current Ids2 applied to the second stack ST2 of the light emitting element LE, and a third driving current Ids3 applied to the third stack ST3 of the light emitting element LE are generated for one frame period. FIGS. 12 to 14 illustrate a first driving current Ids1, a second driving current Ids2, and a third driving current Ids3 when the light emitting element LE represents a peak white gray scale. Because the current density of the second driving current Ids2 is greater than the current density of the first driving current Ids1, a second peak current value Ipeak2 of the second driving current Ids2 may be higher than a first peak current value Ipeak1 of the first driving current Ids1. Because the current density of the third driving current Ids3 is greater than the current density of the second driving current Ids2, a third peak current value Ipeak3 of the third driving current Ids3 may be higher than a second peak current value Ipeak2 of the second driving current Ids2. The peak white gray scale indicates the brightest brightness that may be represented by the light emitting element LE.

Referring to FIGS. 12 to 14, so that the first stack ST1 of the light emitting element LE emits the first light of the same wavelength band regardless of the gray scale, a current density of the first driving current Ids1 may be maintained uniformly regardless of the gray scale. In addition, so that the second stack ST2 of the light emitting element LE emits the second light of the same wavelength band regardless of the gray scale, a current density of the second driving current Ids2 may be maintained uniformly regardless of the gray scale. Also, so that the third stack ST2 of the light emitting element LE emits the third light of the same wavelength band regardless of the gray scale, a current density of the third driving current Ids3 may be maintained uniformly regardless of the gray scale.

The gray scale of the first stack ST1 of the light emitting element LE may be adjusted in accordance with a period EP1 of the first driving current Ids1 applied to the first stack ST1. For example, the longer the period EP1 of the first driving current Ids1 is, the closer the first stack ST1 may represent a gray scale close to a peak white gray scale, and the shorter the period EP1 of the first driving current Ids1 is, the closer the first stack ST1 may represent a gray scale close to a peak black gray scale.

The gray scale of the second stack ST2 of the light emitting element LE may be adjusted in accordance with a period EP2 of the second driving current Ids2 applied to the second stack ST2. For example, the longer the period EP2 of the second driving current Ids2 is, the closer the second stack ST2 may represent a gray scale close to the peak white gray scale, and the shorter the period EP2 of the second driving current Ids2 is, the closer the second stack ST2 may represent a gray scale close to the peak black gray scale.

The gray scale of the third stack ST3 of the light emitting element LE may be adjusted in accordance with a period EP3 of the third driving current Ids3 applied to the second stack ST2. For example, the longer the period EP3 of the third driving current Ids3 is, the closer the third stack ST3 may represent a gray scale close to the peak white gray scale, and the shorter the period EP3 of the third driving current Ids3 is, the closer the second stack ST2 may represent a gray scale close to the peak black gray scale.

Therefore, the light emitting element LE may represent various gray scales in accordance with the periods of applying the driving currents of the respective stacks ST1, ST2, and ST3.

Hereinafter, a manufacturing process of the display device 1 according to one or more embodiments of the present disclosure will be described with reference to other drawings.

Figure 15:
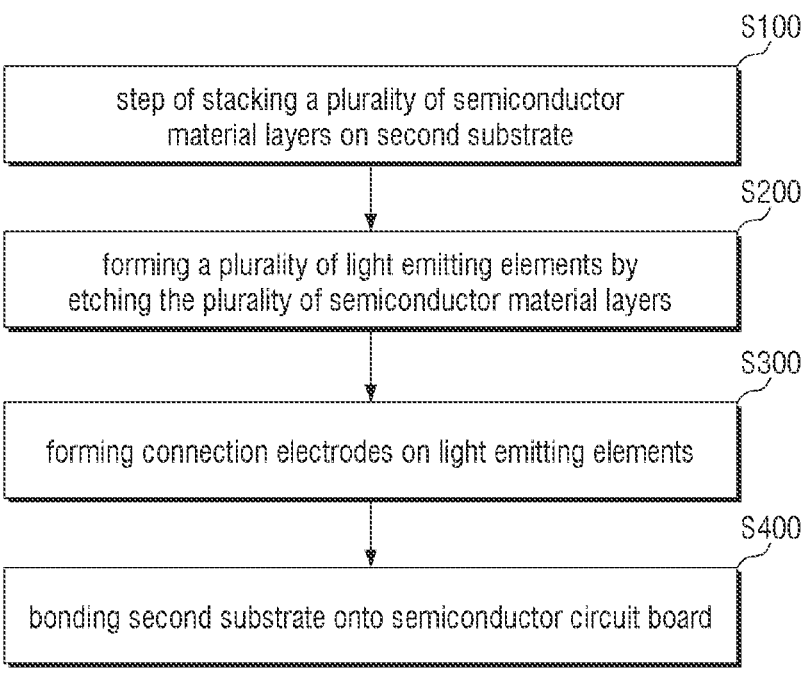
FIG. 15 is a flow chart illustrating a method for manufacturing a display device according to one or more embodiments of the present disclosure.

FIG. 15 is a flow chart illustrating a method for manufacturing a display device according to one or more embodiments of the present disclosure. FIGS. 16 to 28 are cross-sectional and perspective views illustrating a method for manufacturing a display device according to one or more embodiments of the present disclosure.

In FIGS. 16 to 28, a structure based on the order of forming the respective layers of the display panel 10 of the display device 1 is shown as a cross-section. In FIGS. 16 to 28, the manufacturing process of the light emitting element layer 120 is mainly shown, which may correspond to the cross-sectional view of FIG. 6. Hereinafter, a method for manufacturing the display device shown in FIGS. 16 to 28 will be described in conjunction with FIG. 15.

Figure 16:
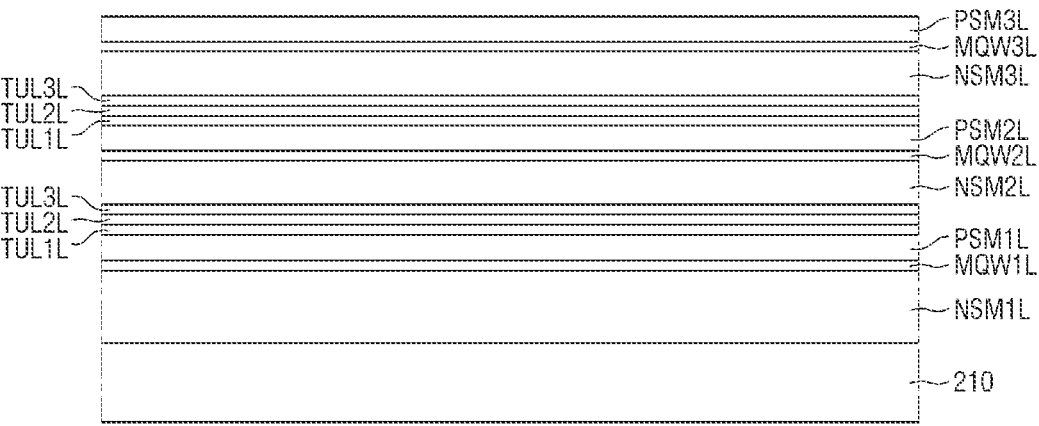

Referring to FIG. 16, a plurality of semiconductor material layers NSM1L, MQW1L, PSM1L, TUL1L, TUL2L, TUL3L, NSM2L, MQW2L, PSM2L, TUL1L, TUL2L, TUL3L, NSM3L, MQW3L, and PSM3L are formed on a second substrate 210 that is a base substrate (S100 in FIG. 15).

First, the second substrate 210 is prepared. The second substrate 210 may be a sapphire substrate ($Al_2O_3$) or a silicon wafer containing silicon, but is not limited thereto. In one or more embodiments, the second substrate 210 will be described as a sapphire substrate by way of example.

The plurality of semiconductor material layers NSM1L, MQW1L, PSM1L, TUL1L, TUL2L, TUL3L, NSM2L, MQW2L, PSM2L, TUL1L, TUL2L, TUL3L, NSM3L, MQW3L, and PSM3L are formed on the second substrate 210. The plurality of semiconductor material layers NSM1L, MQW1L, PSM1L, TUL1L, TUL2L, TUL3L, NSM2L, MQW2L, PSM2L, TUL1L, TUL2L, TUL3L, NSM3L, MQW3L, and PSM3L may be formed by growing seed crystals. In this case, examples of a method of forming the semiconductor material layers may include an electron beam deposition method, a physical vapor deposition (PVD) method, a chemical vapor deposition (CVD) method, a plasma laser deposition (PLD) method, a dual-type thermal evaporation method, a sputtering method, and a metal organic chemical vapor deposition (MOCVD) method. Preferably, the semiconductor material layers may be formed by the metal organic chemical vapor deposition (MOCVD) method, but is not limited thereto.

A precursor material for forming the plurality of semiconductor material layers NSM1L, MQW1L, PSM1L, TUL1L, TUL2L, TUL3L, NSM2L, MQW2L, PSM2L, TUL1L, TUL2L, TUL3L, NSM3L, MQW3L, and PSM3L is not particularly limited within the range that may typically be selected to form a target material. For example, the precursor material may be a metal precursor containing an alkyl group, such as a methyl group or an ethyl group. For example, the precursor material may be, but is not limited to, a compound such as trimethyl gallium ($Ga(CH_3)_3$), trimethyl aluminum ($Al(CH_3)_3$), and triethyl phosphate ($((C_2H_5)_3PO_4)$).

In detail, a first n-type semiconductor material layer NSM1L is formed on the second substrate 210. A first active material layer MQW1L, a first p-type semiconductor material layer PSM1L, a first tunnel material layer TUL1L, a second tunnel material layer TUL2L, a third tunnel material layer TUL3L, a second n-type semiconductor material layer NSM2L, a second active material layer MQW2L, a second p-type semiconductor material layer PSM2L, another first tunnel material layer TUL1L, another second tunnel material layer TUL2L, another third tunnel material layer TUL3L, a third n-type semiconductor material layer NSM3L, a third active material layer MQW3L, and a third p-type semiconductor material layer PSM3L are sequentially formed on the first n-type semiconductor material layer NSM1L by the aforementioned method.

The first n-type semiconductor layer NSM1L is shown as being directly formed on the second substrate 210, but is not limited thereto. An undoped semiconductor layer may further be formed to reduce a lattice constant difference between the first n-type semiconductor material layer NSM1L and the second substrate 210.

Subsequently, the plurality of semiconductor material layers NSM1L, MQW1L, PSM1L, TUL1L, TUL2L, TUL3L, NSM2L, MQW2L, PSM2L, TUL1L, TUL2L, TUL3L, NSM3L, MQW3L, and PSM3L are etched to form the plurality of light emitting elements LE (S200 of FIG. 15).

Figure 17:
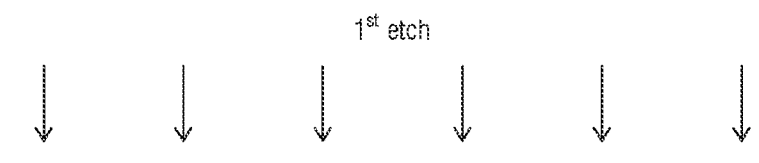
Figure 17:
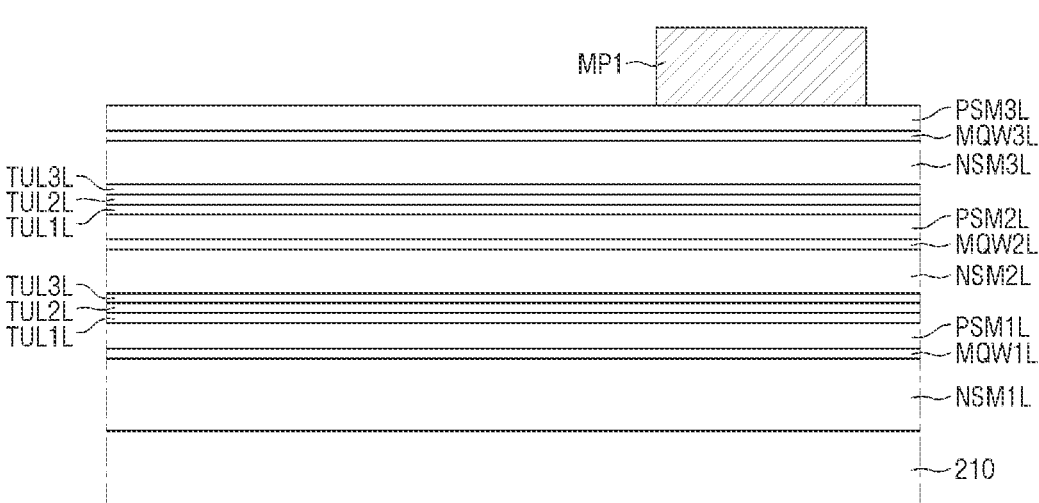
Figure 18:
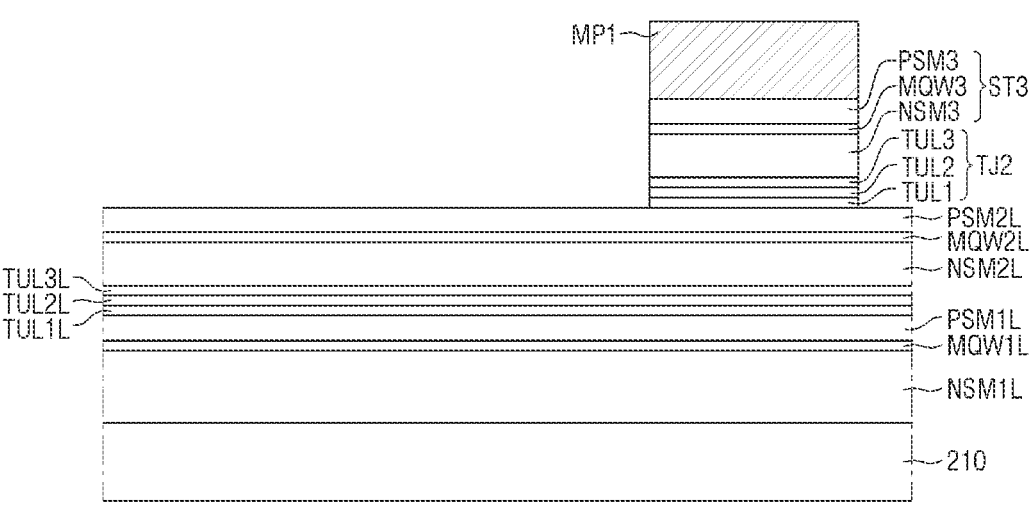

Referring to FIGS. 17 and 18, a plurality of first mask patterns MP1 are formed on the third p-type semiconductor material layer PSM3L. The first mask pattern MP1 may be a hard mask that includes an inorganic material, or may be a photoresist mask that includes an organic material. The first mask pattern MP1 allows the plurality of semiconductor material layers NSM1L, MQW1L, PSM1L, TUL1L, TUL2L, TUL3L, NSM2L, MQW2L, PSM2L, TUL1L, TUL2L, TUL3L, NSM3L, MQW3L, and PSM3L not to be etched in respective areas corresponding to the first mask pattern MP1. Subsequently, a portion of the plurality of semiconductor material layers NSM1L, MQW1L, PSM1L, TUL1L, TUL2L, TUL3L, NSM2L, MQW2L, PSM2L, TUL1L, TUL2L, TUL3L, NSM3L, MQW3L, and PSM3L is etched using the plurality of first mask patterns MP1 as masks ($1^{st}$ etch).

According to the above etching process ($1^{st}$ etch), the third n-type semiconductor material layer NSM3L, the third active material layer MQW3L, and the third p-type semiconductor material layer PSM3L may be etched and patterned, and the first tunnel material layer TUL1L, the second tunnel material layer TUL2L, and the third tunnel material layer TUL3L, which are in contact with the third n-type semiconductor material layer NSM3L, may be etched and patterned. In addition, the time of the etching process ($1^{st}$ etch) may be adjusted such that the first n-type semiconductor material layer NSM1L, the first active material layer MQW1L, the first p-type semiconductor material layer PSM1L, the first tunnel material layer TUL1L, the second tunnel material layer TUL2L, the third tunnel material layer TUL3L, the second n-type semiconductor material layer NSM2L, the second active material layer MQW2L, and the second p-type semiconductor material layer PSM2L are not etched.

The semiconductor material layers may be etched by conventional methods. For example, the semiconductor material layers may be etched by a dry etching method, a wet etching method, a reactive ion etching (RIE) process, a deep reactive ion etching (DRIE) method, inductively coupled plasma reactive ion etching (ICP-RIE) method or the like. In case of the dry etching method, anisotropic etching may be performed to be suitable for vertical etching. When the aforementioned etching method is used, an etchant may be $Cl_2$ or $O_2$, but is not limited thereto.

Therefore, a third stack ST3, which includes a third p-type semiconductor layer PSM3, a third active layer MQW3, and a third n-type semiconductor layer NSM3, and a second tunnel function layer TJ2, which includes a third tunnel layer TUL3, a second tunnel layer TUL2, and a first tunnel layer TUL1, are formed below the first mask pattern MP1. After the etching process ($1^{st}$ etch) is completed, the first mask pattern MP1 is removed by strip.

Figure 19:
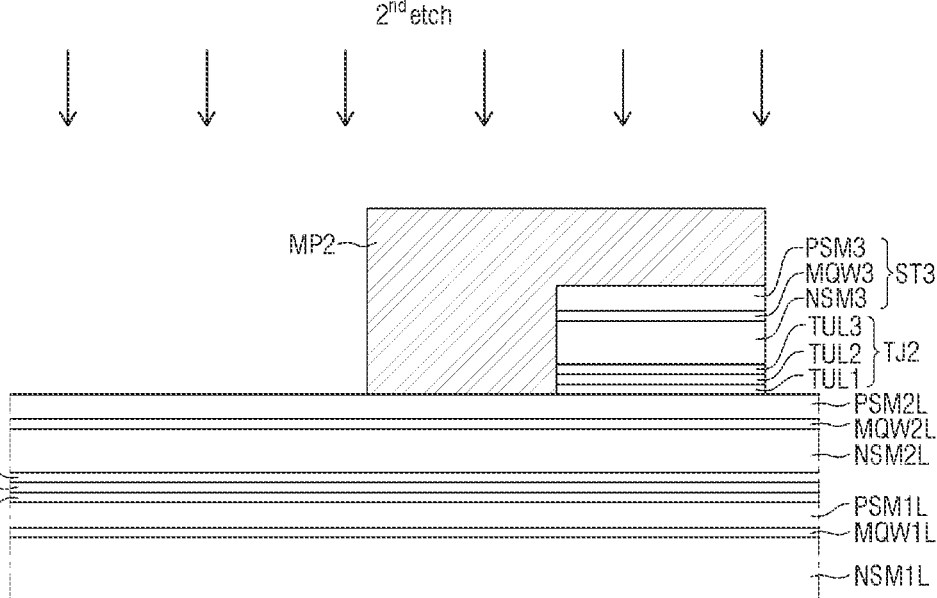
Figure 20:
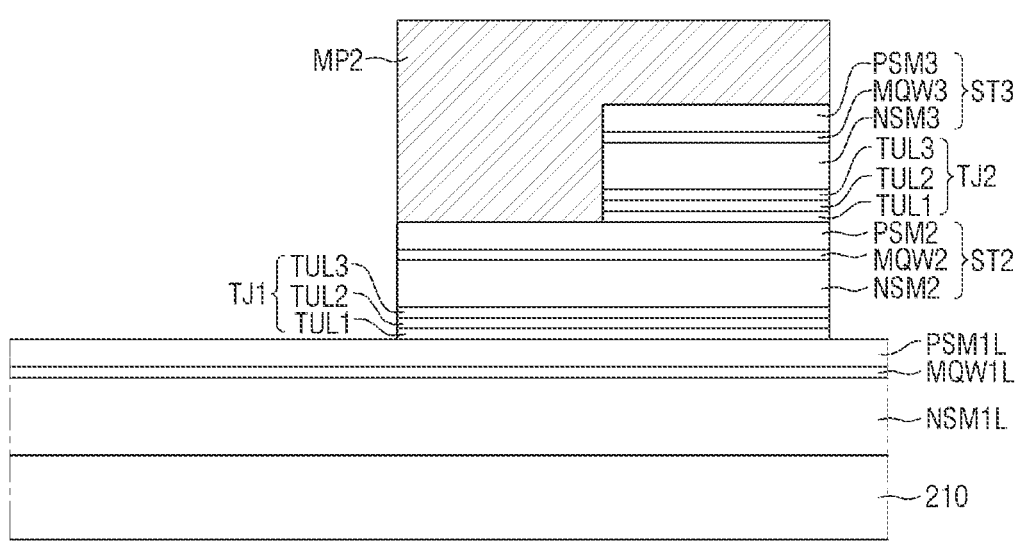
Figure 22:
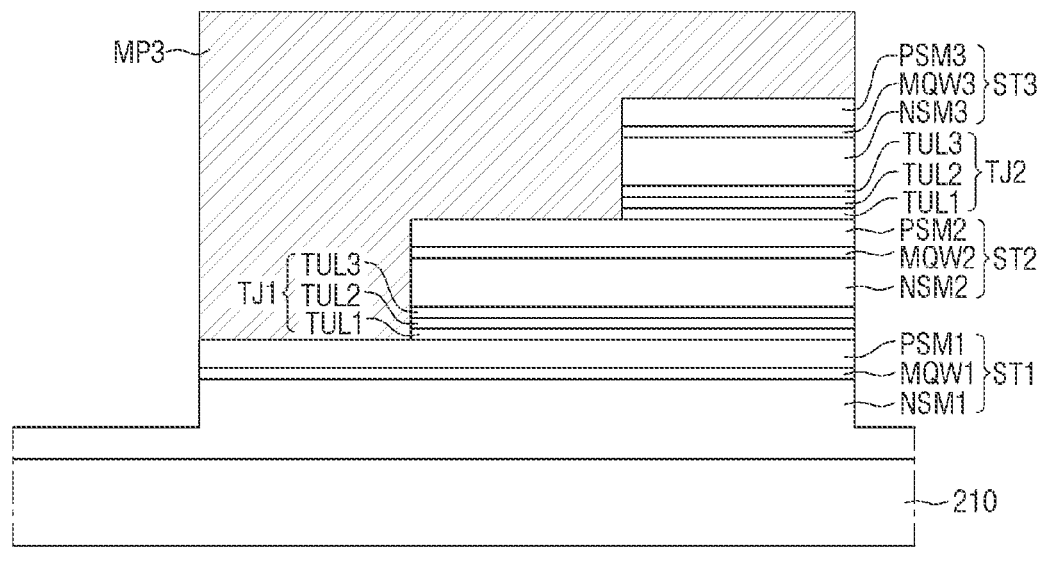

Next, referring to FIGS. 19 and 20, a plurality of second mask patterns MP2 are formed on the third p-type semiconductor layer PSM3 of the third stack ST3 and the second p-type semiconductor material layer PSM2L. Subsequently, a portion of the plurality of semiconductor material layers NSM1L, MQW1L, PSM1L, TUL1L, TUL2L, TUL3L, NSM2L, MQW2L, and PSM2L is etched using the plurality of second mask patterns MP2 as masks ($2^{nd}$ etch).

According to the etching process ($2^{nd}$ etch), the second n-type semiconductor material layer NSM2L, the second active material layer MQW2L, and the second p-type semiconductor material layer PSM2L are etched and patterned, and the first tunnel material layer TUL1L, the second tunnel material layer TUL2L, and the third tunnel material layer TUL3L, which are in contact with the second n-type semiconductor material layer NSM2L, may be etched and patterned. In addition, the time of second etching time ($2^{nd}$ etch) may be adjusted such that the first n-type semiconductor material layer NSM1L, the first active material layer MQW1L, and the first p-type semiconductor material layer PSM1L are not etched.

Therefore, a second stack ST2, which includes a second p-type semiconductor layer PSM2, a second active layer MQW2 and a second n-type semiconductor layer NSM2, and a first tunnel function layer TJ1, which includes a third tunnel layer TUL3, a second tunnel layer TUL2, and a first tunnel layer TUL1, are formed below the second mask pattern MP2. After the etching process ($2^{nd}$ etch) is completed, the second mask pattern MP2 is removed by strip.

Next, referring to FIGS. 21 to 24, a plurality of third mask patterns MP3 are formed on the second p-type semiconductor layer PSM2 of the second stack ST2 and the first p-type semiconductor material layer PSM1L. Subsequently, a portion of the plurality of semiconductor material layers NSM1L, MQW1L and PSM1L is etched using the plurality of third mask patterns MP3 as masks ($3^{rd}$ etch).

According to the etching process ($3^{rd}$ etch), the first n-type semiconductor material layer NSM1L, the first active material layer MQW1L, and the first p-type semiconductor material layer PSM1L may be etched and patterned. In addition, the time of the etching process ($3^{rd}$ etch) may be adjusted such that a thickness (e.g., predetermined thickness) of the first n-type semiconductor material layer NSM1L is not etched, whereby the first n-type semiconductor material layer NSM1L may act as a common layer.

Figure 23:
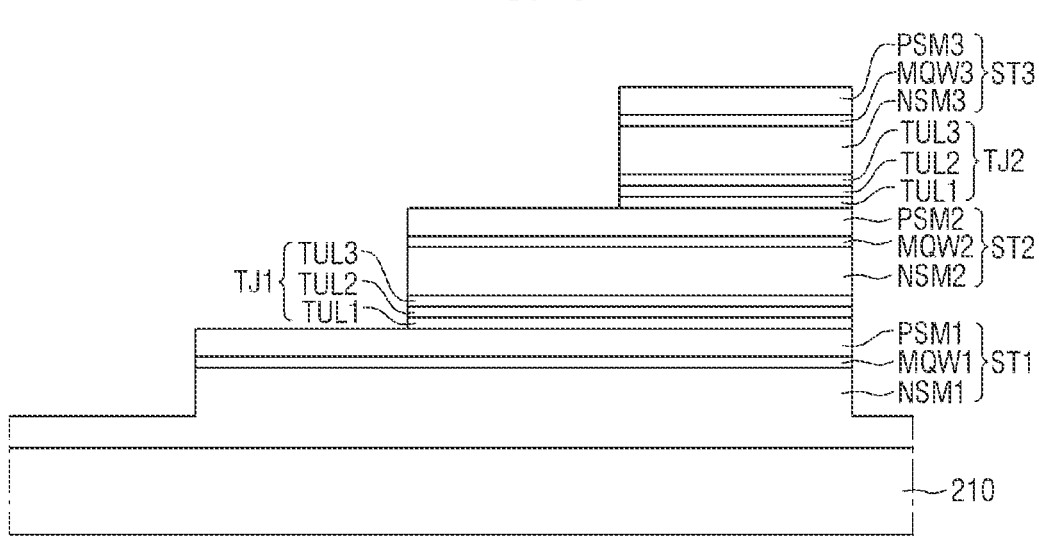
Figure 24:
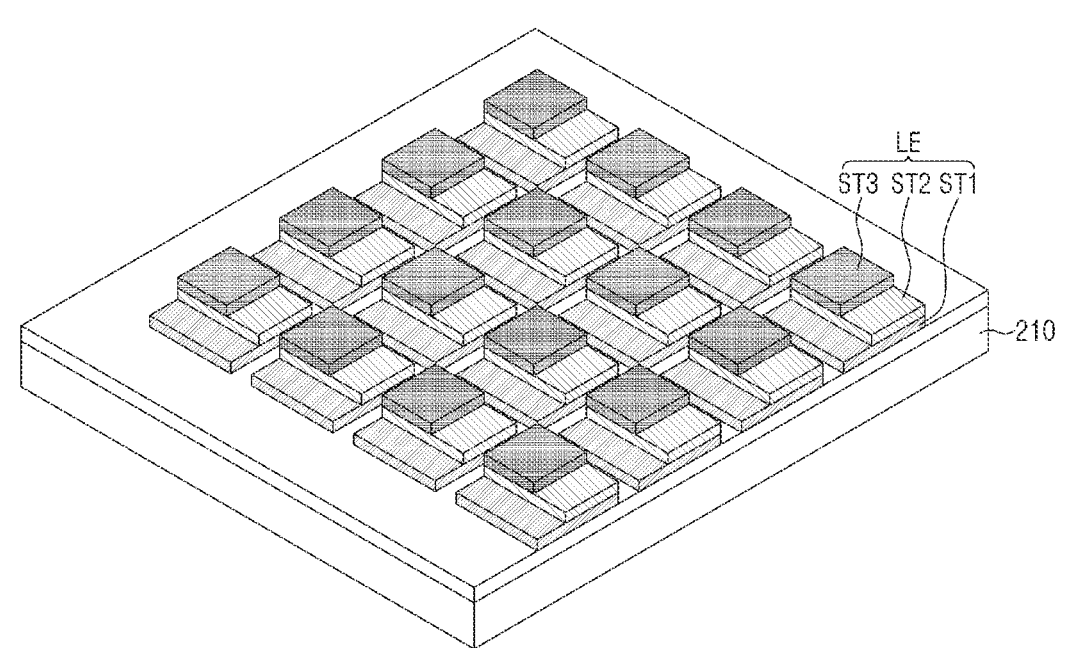

Therefore, the first stack ST1, which includes a first p-type semiconductor layer PSM1, a first active layer MQW1, and a first n-type semiconductor layer NSM1, is formed below the third mask pattern MP3. After the etching process ($3^{rd}$ etch) is completed, the third mask pattern MP3 is removed by strip to form a plurality of light emitting elements LE as shown in FIGS. 23 and 24. The plurality of light emitting elements LE may be spaced apart from one another, but the first n-type semiconductor layers NSM1 of the first stack ST1 may be connected to each other to act as common layers.

Next, a plurality of connection electrodes CNE1, CNE2, CNE3, and CNE4 are formed on the plurality of light emitting elements LE (S300 of FIG. 15).

Figure 25:
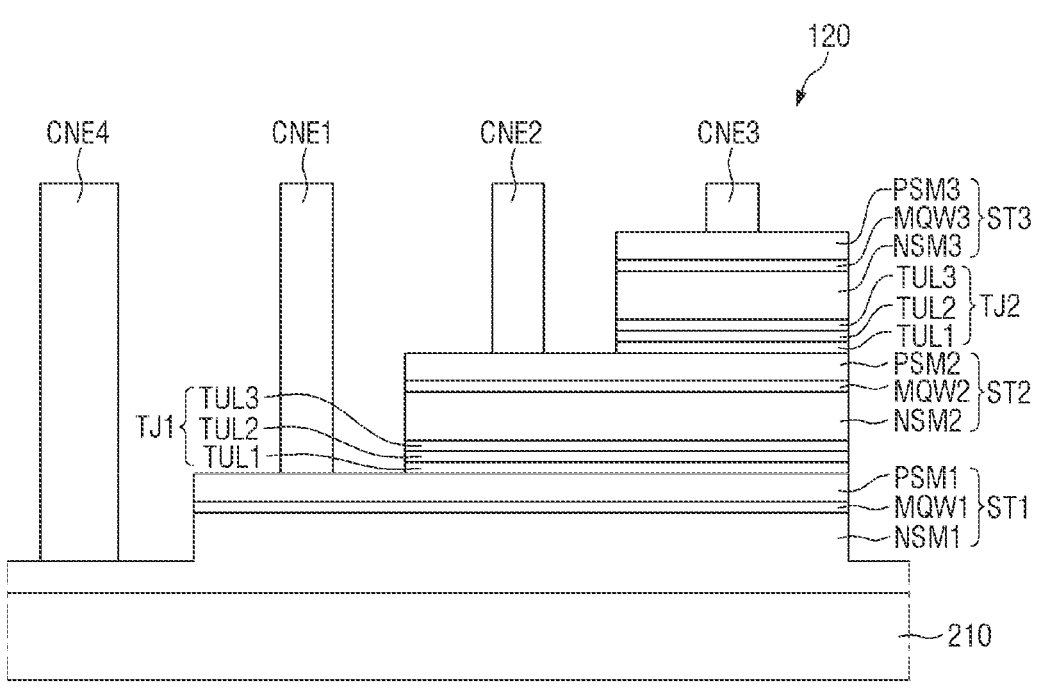
Figure 26:
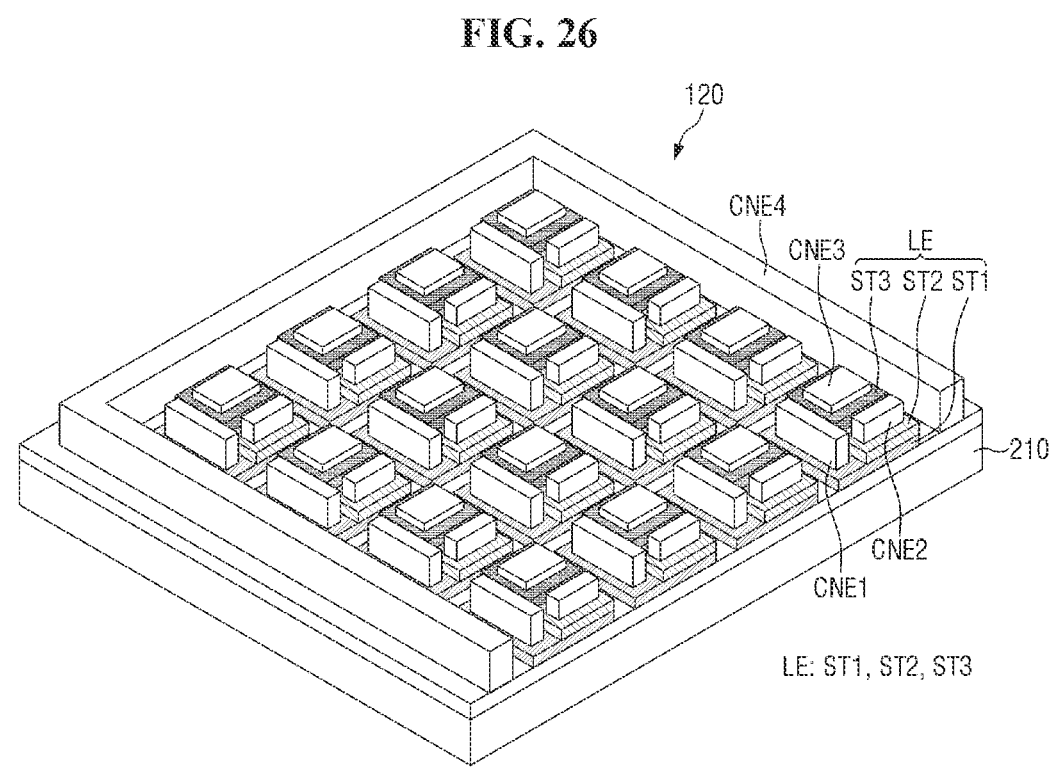

Referring to FIGS. 25 and 26, a connection electrode material layer is deposited on the second substrate 210 and then etched, whereby the connection electrodes CNE1, CNE2, and CNE3 are formed on the plurality of light emitting elements LE, and the common connection electrode CNE4 is formed on the first n-type semiconductor layer NSM1.

The first connection electrode CNE1 of the connection electrodes CNE1, CNE2, and CNE3 is formed on the first stack ST1 of the light emitting element LE, and is directly formed on the first p-type semiconductor layer PSM1 of the first stack ST1. The second connection electrode CNE2 is formed on the second stack ST2 of the light emitting element LE, and is directly formed on the second p-type semiconductor layer PSM2 of the second stack ST2. The third connection electrode CNE3 is formed on the third stack ST3 of the light emitting element LE, and is directly formed on the third p-type semiconductor layer PSM3 of the third stack ST3. The common connection electrode CNE4 is directly formed on the first n-type semiconductor layer NSM1 of the first stack ST1, and is formed to surround the edge of the first n-type semiconductor layer NSM1. Therefore, a light emitting layer 120 in which the plurality of light emitting elements LE and the connection electrodes CNE1, CNE2, CNE3, and CNE4 are formed is formed on the second substrate 210.

Next, the light emitting element layer 120 is bonded onto the semiconductor circuit board 100 (S400 of FIG. 15).

Figure 27:
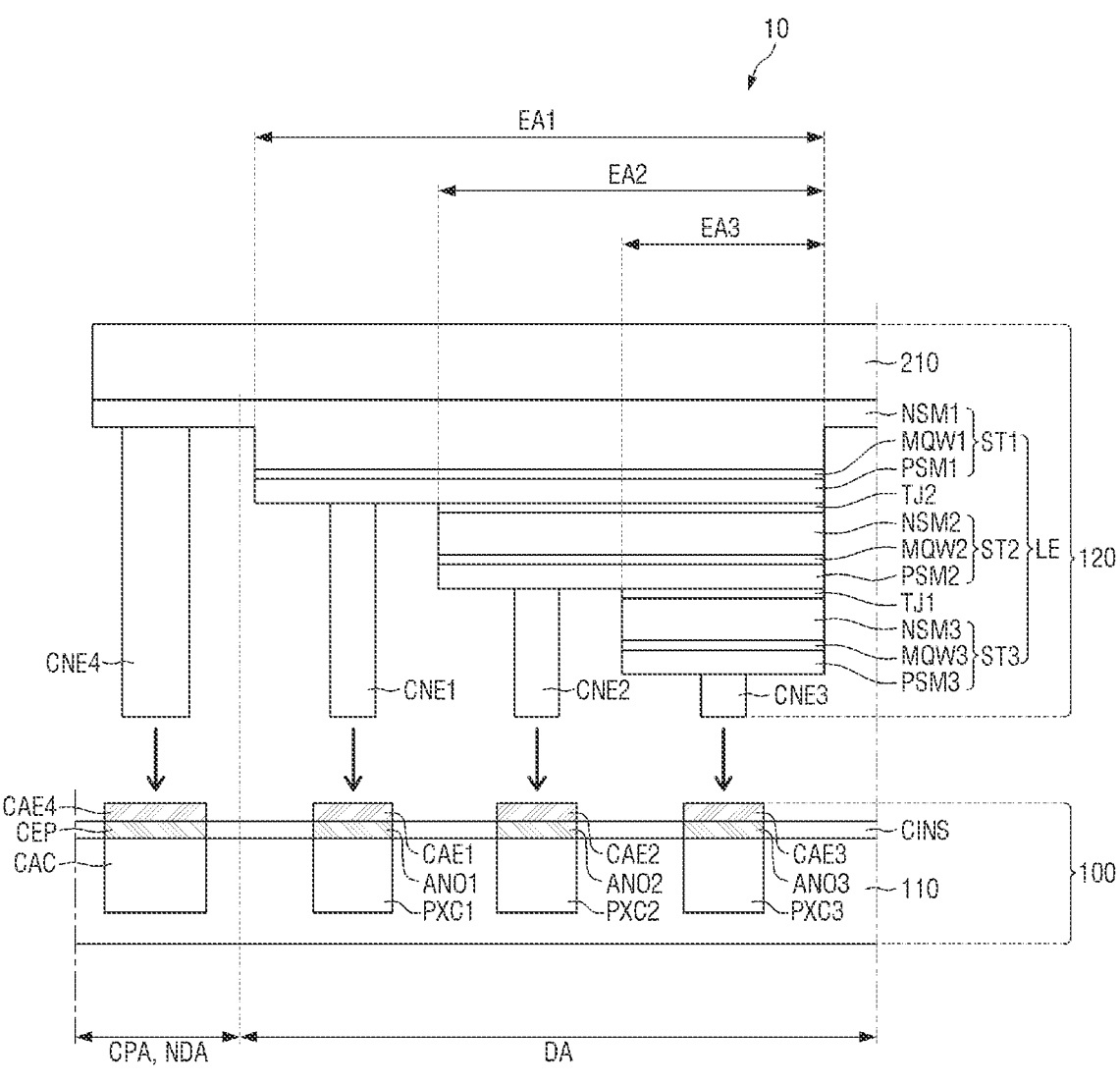
Figure 28:
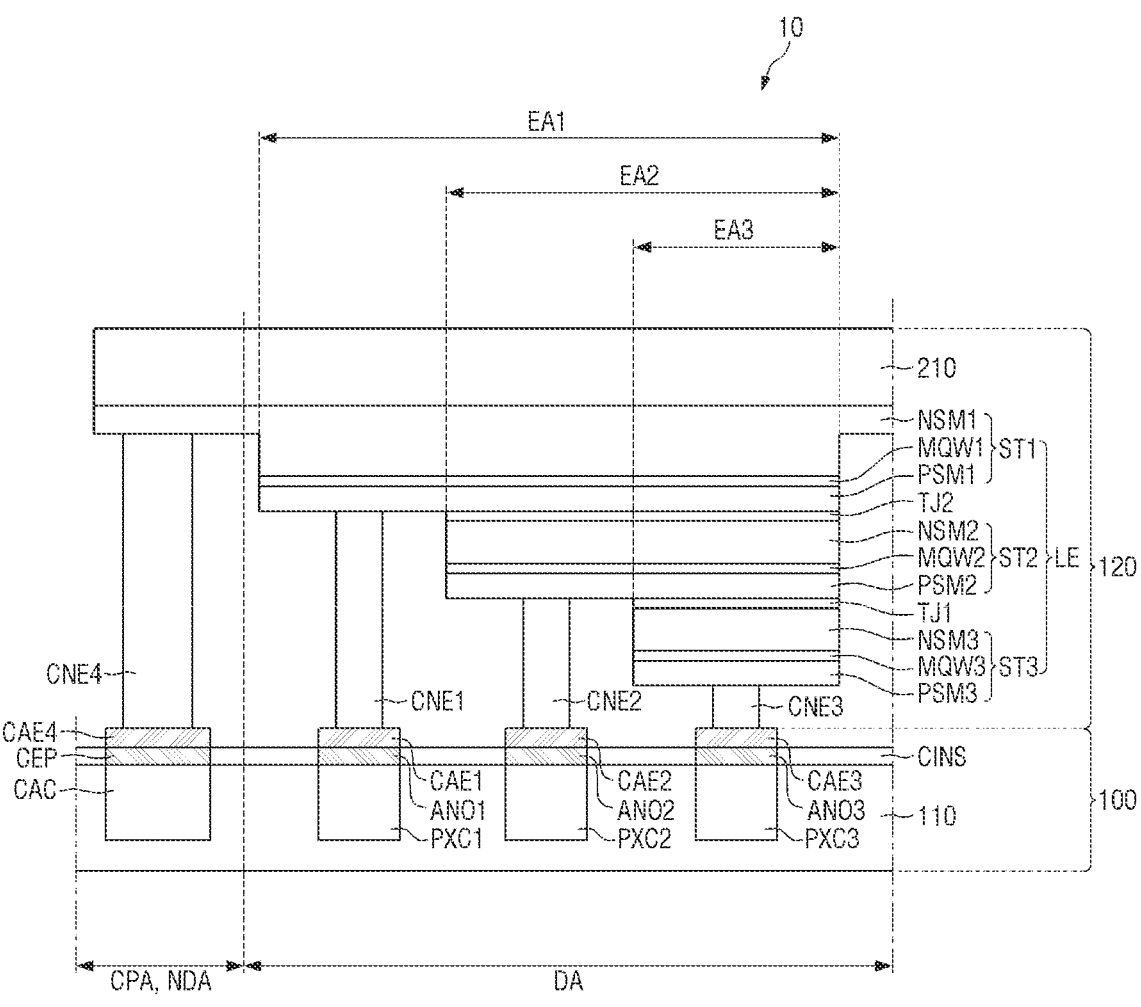

Referring to FIGS. 27 and 28, first of all, the semiconductor circuit board 100 is prepared. The semiconductor circuit board 100 may include a first substrate 110, pixel circuits PXC1, PXC2, and PXC3, a common circuit CAC, pixel electrodes ANO1, ANO2, and ANO3, a common electrode CEP, contact electrodes CAE1, CAE2, CAE3, and CAE4, and a circuit insulating layer CINS.

In detail, the pixel electrodes ANO1, ANO2, and ANO3 and the common electrode CEP are formed on the first substrate 110 in which the plurality of pixel circuits PXC are formed, and the circuit insulating layer CINS for planarizing a step difference of the pixel electrodes and the common electrode is formed on the first substrate 110. A contact electrode material layer is stacked on the pixel electrodes ANO1, ANO2, and ANO3 and the common electrode CEP and then etched to form the contact electrodes CAE1, CAE2, CAE3, and CAE4. The contact electrode material layer may include gold (Au), copper (Cu), aluminum (Al), or tin (Sn).

Subsequently, after the light emitting element layer 120 is aligned on the semiconductor circuit board 100, the semiconductor circuit board 100 and the light emitting element layer 120 are bonded to each other.

In detail, the contact electrodes CAE1, CAE2, CAE3, and CAE4 of the semiconductor circuit board 100 are brought into contact with the connection electrodes CNE1, CNE2, CNE3, and CNE4 of the light emitting element layer 120. Subsequently, the contact electrodes CAE1, CAE2, CAE3 and CNE4 are bonded to the connection electrodes CNE1, CNE2, CNE3, and CNE4 by melting at a temperature (e.g., predetermined temperature). Therefore, the display device 1 according to one or more embodiments of the present disclosure is manufactured.

As described above, in the display device 1 according to one or more embodiments of the present disclosure, the tunnel function layers TJ1 and TJ2 may be located among the plurality of stacks ST1, ST2, and ST3 of the light emitting element LE to enable movement of electrons and holes among the stacks ST1, ST2, and ST3, whereby the respective stacks ST1, ST2, and ST3 of the light emitting element LE may emit light. Therefore, blue, green, and red light may be emitted from one light emitting element LE, so that a plurality of subpixels may be omitted and one pixel PX may be configured by one light emitting element LE. Therefore, the structure and the manufacturing process of the display device 1 may be simplified, and the display device 1 of high resolution may be implemented.

In addition, the connection electrodes CNE1, CNE2, CNE3, and CNE4 may respectively be located in the plurality of stacks ST1, ST2, and ST3 of the light emitting element LE, whereby the plurality of stacks ST1, ST2, and ST3 may emit light individually, concurrently, or substantially simultaneously. Also, the period for applying a current in each of the stacks ST1, ST2, and ST3 may be adjusted to represent a gray scale, whereby a full color may be implemented.

Figure 29:
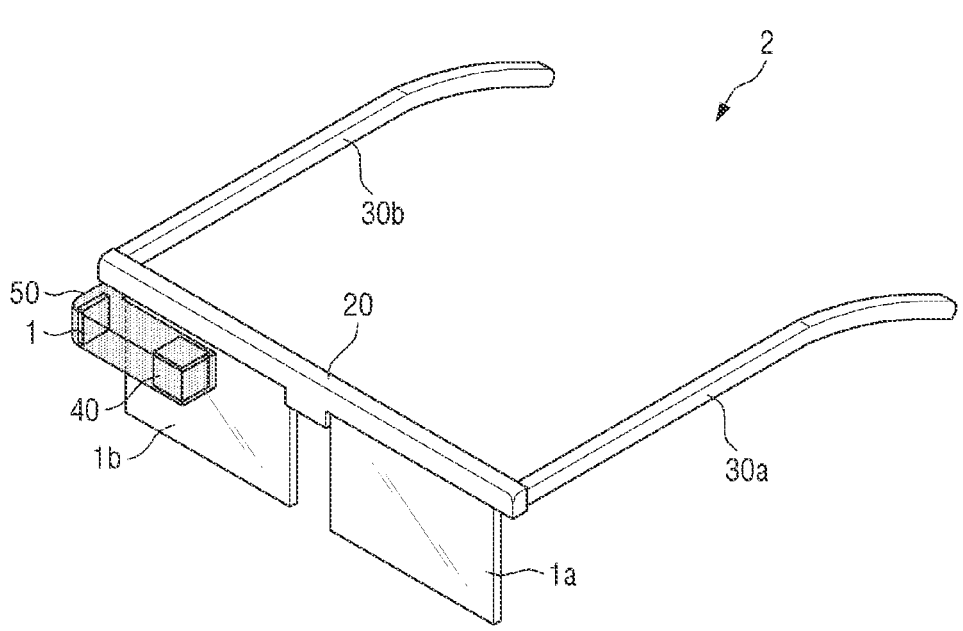
FIG. 29 is an view illustrating a virtual reality device including a display device according to one or more embodiments.

FIG. 29 is an view illustrating a virtual reality device including a display device according to one or more embodiments. A virtual reality device 2 to which a display device 1 according to one or more embodiments is applied is illustrated in FIG. 29.

Referring to FIG. 29, the virtual reality device 2 according to one or more embodiments may be a glasses-type device. The virtual reality device 2 according to one or more embodiments may include a display device 1, a left-eye lens 1a, a right-eye lens 1b, a support frame 20, glasses frame legs 30a and 30b, a reflection member 40, and a display device accommodating portion 50.

Although FIG. 29 illustrates the virtual reality device 2 that includes glasses frame legs 30a and 30b, the virtual reality device 2 according to one or more embodiments may be applied to a head mounted display including a head mounting band, which may be mounted on a head, instead of the glasses frame legs 30a and 30b. That is, the virtual reality device 2 according to one or more embodiments is not limited to that shown in FIG. 29, and is applicable to various electronic devices in various forms.

The display device accommodating portion 50 may include a display device 1 and a reflection member 40. An image displayed on the display device 1 may be reflected by the reflection member 40 and may be provided to a user's right eye through the right-eye lens 1b. For this reason, the user may view a virtual reality image displayed on the display device 1 through the right eye.

Although FIG. 29 illustrates that the display device accommodating portion 50 is located at a right end of the support frame 20, the present disclosure is not limited thereto. For example, the display device accommodating portion 50 may be located at a left end of the support frame 20, and in this case, the image displayed on the display device 1 may be reflected by the reflection member 40 and provided to the user's left eye through the left-eye lens 1a. For this reason, the user may view the virtual reality image displayed on the display device 1 through the left eye. Alternatively, the display device accommodating portion 50 may be located at both the left end and the right end of the support frame 20, and in this case, the user may view the virtual reality image displayed on the display device 1 through both the left eye and the right eye.

Figure 30:
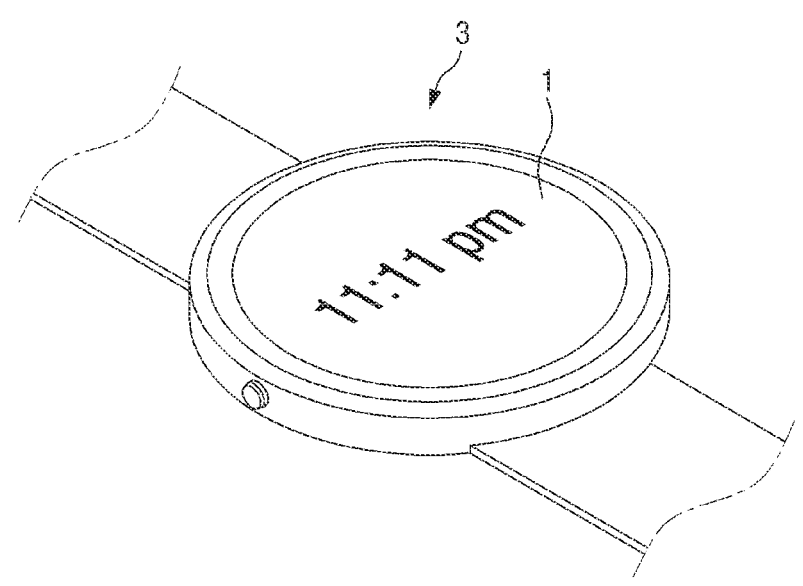
FIG. 30 is an view illustrating a smart device including a display device according to one or more embodiments.

FIG. 30 is an view illustrating a smart device including a display device according to one or more embodiments.

Referring to FIG. 30, a display device 1 according to one or more embodiments may be applied to a smart watch 3 that is one of the smart device.

Figure 31:
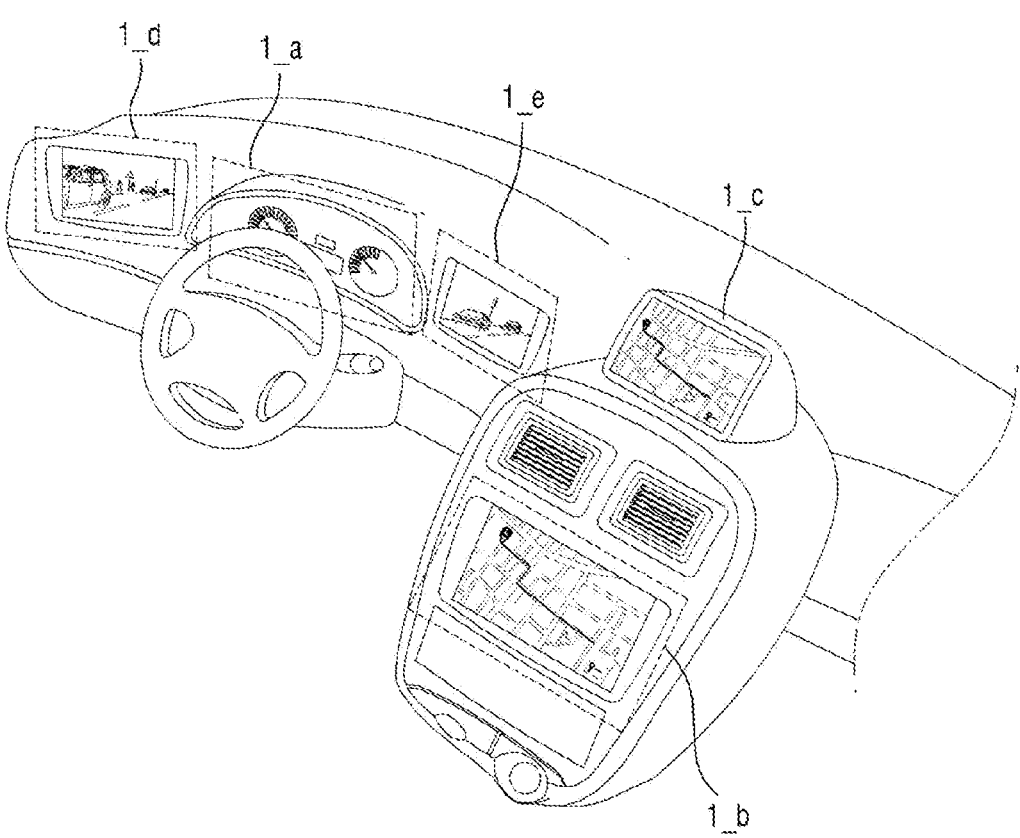
FIG. 31 is an view illustrating a vehicle including a display device according to one or more embodiments.

FIG. 31 is an view illustrating a vehicle including a display device according to one or more embodiments. A vehicle to which the display device 1 according to one or more embodiments is applied is illustrated in FIG. 31.

Referring to FIG. 31, display devices 1_a, 1_b and 1_c according to one or more embodiments may be applied to a dashboard of the vehicle, applied to a center fascia of the vehicle, or applied to a center information display (CID) located on the dashboard of the vehicle. In addition, display devices 1_d and 1_e according to one or more embodiments may be applied to a room mirror display that replaces a side mirror of the vehicle.

Figure 32:
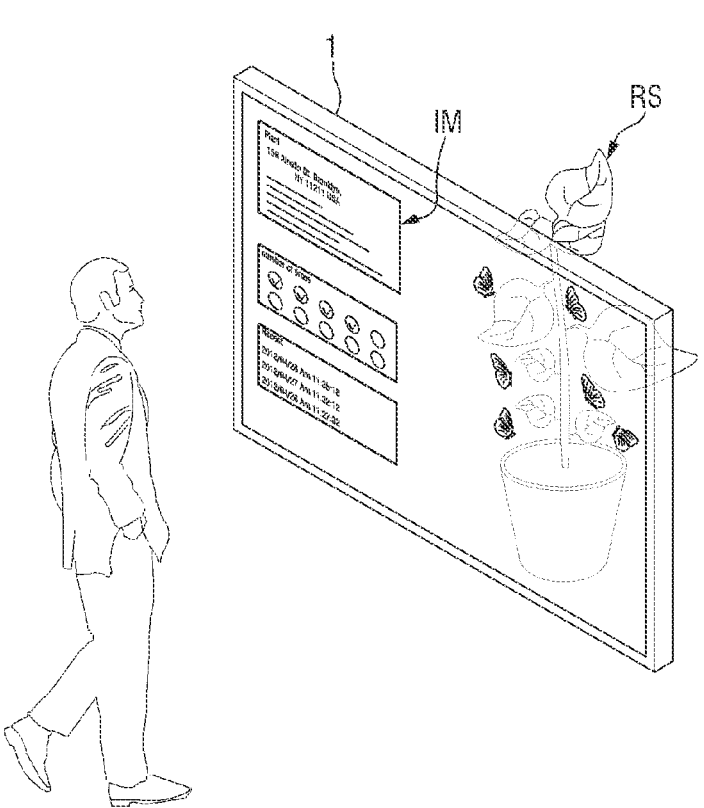
FIG. 32 is an view illustrating a transparent display device including a display device according to one or more embodiments.

FIG. 32 is an view illustrating a transparent display device including a display device according to one or more embodiments.

Referring to FIG. 32, the display device 1 according to one or more embodiments may be applied to the transparent display device. The transparent display device may display an image I'm, and at the same time may transmit light therethrough. Therefore, a user located on a front surface of the transparent display device may not only view the image IM displayed on the display device 1, but also may view an object RS or background located on a rear surface of the transparent display device. When the display device 1 is applied to the transparent display device, the semiconductor circuit board 100 of the display device 1 shown in FIGS. 5 and 6 may include a light transmitting portion capable of transmitting light, or may be formed of a material capable of transmitting light.

In concluding the detailed description, those skilled in the art will appreciate that many variations and modifications can be made to the embodiments without substantially departing from the aspects of the present disclosure. Therefore, the disclosed embodiments are used in a generic and descriptive sense only and not for purposes of limitation.

What is claimed is:

1. A display device comprising:
a substrate;
pixel electrodes on the substrate; and
light emitting elements on the pixel electrodes, each of the
light emitting elements comprising:
a first stack configured to emit first light;
a second stack comprising a second active layer, below
the first stack, and configured to emit second light;
a third stack comprising a third active layer, below the
second stack, and configured to emit third light; and
tunnel function layers including a first tunnel function
layer between the first stack and the second stack,
and a second tunnel function layer between the
second stack and the third stack,
wherein an area of the first tunnel functional layer is the
same as an area of the second active layer of the second
stack, and an area of the second tunnel functional layer
is the same as an area of the third active layer of the
third stack, and the area of the first tunnel functional
layer is greater than the area of the second tunnel
functional layer.

2. The display device of claim 1, wherein the first stack
comprises a first active layer for emitting the first light,
wherein the second active layer is configured to emit the
second light, and
wherein the third active layer is configured to emit the
third light.

3. The display device of claim 1, wherein the first light is
blue light, the second light is green light, and the third light
is a red light.

4. The display device of claim 2, wherein the first stack
comprises a first n-type semiconductor layer and a first
p-type semiconductor layer, which are spaced apart from
each other with the first active layer interposed therebe-
tween,
wherein the second stack comprises a second n-type
semiconductor layer and a second p-type semiconduc-
tor layer, which are spaced apart from each other with
the second active layer interposed therebetween, and
wherein the third stack comprises a third n-type semicon-
ductor layer and a third p-type semiconductor layer,
which are spaced apart from each other with the third
active layer interposed therebetween.

5. The display device of claim 4, wherein each of the first
tunnel function layer and the second tunnel function layer
comprises a first tunnel layer comprising an n-type semi-
conductor, a second tunnel layer comprising an n-type
semiconductor, and a third tunnel layer comprising a p-type
semiconductor.

6. The display device of claim 5, wherein the second
tunnel layer is between the first tunnel layer and the third
tunnel layer, and
wherein a thickness of the second tunnel layer is less than
a thickness of the first tunnel layer, and is less than a
thickness of the third tunnel layer.

7. The display device of claim 5, wherein a concentration
of a p-type dopant doped in the third tunnel layer is lower
than a concentration of an n-type dopant doped in the first
tunnel layer, and is less than a concentration of an n-type
dopant doped in the second tunnel layer.

8. The display device of claim 5, wherein the first tunnel
layer of the first tunnel function layer is in contact with the
first p-type semiconductor layer of the first stack,
wherein the third tunnel layer of the first tunnel function
layer is in contact with the second n-type semiconduc-
tor layer of the second stack, wherein the first tunnel layer of the second tunnel function
layer is in contact with the second p-type semiconduc-
tor layer of the second stack, and
wherein the third tunnel layer of the second tunnel func-
tion layer is in contact with the third n-type semicon-
ductor layer of the third stack.

9. The display device of claim 4, wherein the first n-type
semiconductor layer of the first stack is a common layer
located continuously in the light emitting elements.

10. The display device of claim 2, wherein each of the first
active layer, the second active layer, and the third active
layer comprises indium,
wherein an indium content of the third active layer is
greater than that of the second active layer, and
wherein an indium content of the second active layer is
greater than that of the first active layer.

11. An electronic device comprising:
a substrate;
pixel electrodes on the substrate;
light emitting elements on the pixel electrodes, each of the
light emitting elements comprising:
a first stack comprising a first n-type semiconductor
layer and a first p-type semiconductor layer with a
first active layer for emitting first light therebetween;
a second stack below the first stack, and comprising a
second n-type semiconductor layer and a second
p-type semiconductor layer with a second active
layer for emitting second light therebetween;
a third stack below the second stack, and comprising a
third n-type semiconductor layer and a third p-type
semiconductor layer with a third active layer for
emitting third light therebetween;
tunnel function layers respectively between the first
stack and the second stack, and between the second
stack and the third stack; and
connection electrodes connecting the pixel electrodes
with the light emitting elements, the connection elec-
trodes comprising:
a first connection electrode connected to the first p-type
semiconductor layer of the first stack;
a second connection electrode connected to the second
p-type semiconductor layer of the second stack;
a third connection electrode connected to the third
p-type semiconductor layer of the third stack; and
a common connection electrode connected to the first
n-type semiconductor layer of the first stack.

12. The electronic device of claim 11, wherein the first
stack is configured to be driven by driving signals applied to
the first connection electrode and the common connection
electrode,
wherein the second stack is configured to be driven by
driving signals applied to the first connection electrode
and the second connection electrode, and
wherein the third stack is configured to be driven by
driving signals applied to the second connection elec-
trode and the third connection electrode.

13. A display device comprising:
a substrate;
pixel electrodes on the substrate; and
light emitting elements on the pixel electrodes, each of the
light emitting elements comprising:
a first stack for emitting first light in accordance with a
first driving current;
a second stack comprising a second active layer, for
emitting second light in accordance with a second
driving current;

a third stack comprising a third active layer, for emitting third light in accordance with a third driving current; and tunnel function layers including a first tunnel function layer between the first stack and the second stack, a second tunnel function layer and between the second stack and the third stack, wherein an area of the first tunnel functional layer is the same as an area of the second active layer of the second stack, and an area of the second tunnel functional layer is the same as an area of the third active layer of the third stack, and the area of the first tunnel functional layer is greater than the area of the second tunnel functional layer.

14. The display device of claim 13, wherein a current density of the first driving current is maintained uniformly regardless of a gray scale of the first stack, wherein a current density of the second driving current is maintained uniformly regardless of a gray scale of the second stack, and wherein a current density of the third driving current is maintained uniformly regardless of a gray scale of the third stack.

15. The display device of claim 14, wherein an application period of the first driving current is configured to be adjusted in accordance with the gray scale of the first stack, wherein an application period of the second driving current is configured to be adjusted in accordance with the gray scale of the second stack, and wherein an application period of the third driving current is configured to be adjusted in accordance with the gray scale of the third stack.

16. The display device of claim 13, wherein a first light emission area for emitting the first light is partitioned by a planar size of the first stack, wherein a second light emission area for emitting the second light is partitioned by a planar size of the second stack, and wherein a third light emission area for emitting the third light is partitioned by a planar size of the third stack.

17. The display device of claim 16, wherein a size of the first light emission area is larger than that of the second light emission area, and wherein a size of the second light emission area is larger than that of the third light emission area.

* * * * *